(12) United States Patent
Kanada et al.

(10) Patent No.: US 7,416,822 B2
(45) Date of Patent: Aug. 26, 2008

(54) RESIN AND RESIN COMPOSITION

(75) Inventors: Takayuki Kanada, Fuji (JP); Yasuhiro Kataoka, Shizuoka (JP); Motohiro Niwa, Fuji (JP)

(73) Assignee: Asahi Kasei EMD Corporation, Tokyo (JP)

(*) Notice: Subject to any disclaimer, the term of this patent is extended or adjusted under 35 U.S.C. 154(b) by 230 days.

(21) Appl. No.: 10/597,091

(22) PCT Filed: Jan. 18, 2005

(86) PCT No.: PCT/JP2005/000538

§ 371 (c)(1),
(2), (4) Date: Jul. 11, 2006

(87) PCT Pub. No.: WO2005/068535

PCT Pub. Date: Jul. 28, 2005

(65) Prior Publication Data

US 2007/0154843 A1 Jul. 5, 2007

(30) Foreign Application Priority Data

Jan. 20, 2004 (JP) ............................. 2004-012427
Oct. 14, 2004 (JP) ............................. 2004-300679

(51) Int. Cl.
*G03F 7/023* (2006.01)
*G03F 7/30* (2006.01)
*G03F 7/037* (2006.01)
*C08G 69/12* (2006.01)

(52) U.S. Cl. .......... 430/18; 430/191; 430/192; 430/193; 430/270.1; 430/280.1; 430/281.1; 430/325; 430/326; 430/330; 430/906; 528/335; 528/338

(58) Field of Classification Search ............ 430/18, 430/191, 192, 193, 270.1, 280.1, 281.1, 325, 430/326, 330, 906; 528/335, 338
See application file for complete search history.

(56) References Cited

U.S. PATENT DOCUMENTS

| | | | | |
|---|---|---|---|---|
| 2,772,972 A | * | 12/1956 | Herrick et al. | 430/14 |
| 2,797,213 A | * | 6/1957 | Moore | 534/557 |
| 3,669,658 A | * | 6/1972 | Yonezawa et al. | 430/191 |
| 3,904,589 A | * | 9/1975 | Radlmann et al. | 528/310 |
| 4,339,521 A | * | 7/1982 | Ahne et al. | 430/192 |
| 4,395,482 A | * | 7/1983 | Ahne et al. | 430/326 |
| 5,077,378 A | * | 12/1991 | Mueller et al. | 528/185 |
| 5,376,499 A | * | 12/1994 | Hammerschmidt et al. | 430/192 |
| 5,486,447 A | * | 1/1996 | Hammerschmidt et al. | 430/197 |
| 6,071,666 A | * | 6/2000 | Hirano et al. | 430/191 |
| 6,177,225 B1 | * | 1/2001 | Weber et al. | 430/190 |
| 6,376,151 B1 | * | 4/2002 | Takahashi et al. | 430/192 |
| 6,933,087 B2 | | 8/2005 | Suwa et al. | 430/191 |
| 7,049,371 B2 | * | 5/2006 | Enoki et al. | 525/183 |
| 2004/0002572 A1 | * | 1/2004 | Enoki et al. | 524/606 |

FOREIGN PATENT DOCUMENTS

| | | | |
|---|---|---|---|
| JP | 1-046862 | * | 10/1989 |
| JP | 5-027245 | * | 2/1993 |
| JP | 5-102125 | * | 4/1993 |
| JP | 5-197153 | * | 8/1993 |
| JP | 2002-012665 | * | 1/2002 |
| JP | 2002-167442 | * | 6/2002 |
| JP | 2003-105086 | * | 4/2003 |
| KR | 2003-0053471 | | 6/2003 |

OTHER PUBLICATIONS

English Language Abstract of JP 2003-105086.*
English Language Abstract of JP 2002-167442.*
English Language Abstract of JP 5-102125.*
English Language Abstract of JP 1-046862.*
English Language Abstract of JP 5-027245.*
English Language Abstract of JP 2002-012665.*
Ommer H.J., et al., "Photocrosslinkable comb-like polymers for membranes: polyamides from modified 5-aminoisophthalic acid and aromatic diamines". Macromolecular Chemistry and Physics, vol. 197, 1996, pp. 797-809.*

* cited by examiner

*Primary Examiner*—John S Chu
(74) *Attorney, Agent, or Firm*—Greenblum & Bernstein, P.L.C.

(57) ABSTRACT

Disclosed is a hydroxy polyamide represented by the following general formula (1) and having a 5-amino isophthalic acid derivative structure in the main chain structure. (1) (In the formula, m and n represent integers, X represents at least one tetravalent organic group, Y represents at least one divalent organic group having a 5-amino isophthalic acid derivative structure, and Z represents at least one divalent organic group).

10 Claims, No Drawings

RESIN AND RESIN COMPOSITION

TECHNICAL FIELD

The present invention relates to a hydroxypolyamide which is a precursor of a heat-resistant resin, a heat-resistant resin composition comprising the hydroxypolyamide, and a process for producing a cured relief pattern made of the heat-resistant resin, and to a semiconductor device having the relief pattern. More specifically, the present invention relates to a hydroxypolyamide which is a precursor providing a polybenzoxazole resin which is excellent in electrical, mechanical, and physical characteristics, particularly in heat resistance characteristics and suitably used in, for example, interlayer insulating films and surface protective films for semiconductor devices, cover coats for flexible copper-clad boards, solder resist films, liquid crystal alignment layers, and optical waveguides.

BACKGROUND ART

A coating film consisting of a polyimide resin, which combines excellent heat resistance and electrical and mechanical characteristics, has been conventionally used in, for example, insulating materials for electronic parts and passivation films, surface protective films, and interlayer insulating films for semiconductor devices.

In forming the polyimide resin coating film, a non-photosensitive polyimide resin precursor composition or a photosensitive polyimide resin precursor composition can be used. What is provided in the form of the latter can be applied onto a substrate, followed by light exposure, development, and thermal imidation treatment, to more readily form a cured relief pattern resistant to heat. Thus, the polyimide resin precursor composition may be non-photosensitive or photosensitive when the polyimide resin is used as a coating film not required to form a relief pattern, but, in producing a semiconductor device having a cured relief pattern made of the polyimide resin, use of the photosensitive polyimide resin precursor composition enables the significant shortening of the process of the production thereof compared to that of the conventional non-photosensitive polyimide resin precursor composition.

However, when the above-described photosensitive polyimide resin precursor composition is used, it is necessary to employ a large amount of organic solvent such as a pyrrolidone or a ketone as a developer in the process of the development thereof. Thus, there is a need for such a countermeasure that the organic solvent is removed in view of safety and increased recent concern over environmental issues. To that end, various heat-resistant photosensitive resin materials developable with a dilute alkali aqueous solution have been recently proposed as is the case with a photoresist in the field of the above-described materials Among others, processes using a hydroxypolyamide soluble in an alkali aqueous solution, for example, a polybenzoxazole resin precursor, have received attention in recent years; for example, processes using, as a positive photosensitive material, a composition in which the above-described precursor is mixed with an optically active ingredient such as naphtoquinonediazide have been proposed (see e.g. JP-B-01-46862). A process using, as a negative photosensitive material, a composition in which a precursor where groups having photopolymerizable unsaturated double bonding are introduced into part of the hydroxyl groups of the above-described precursor is mixed with a compound having photopolymerizable unsaturated double bonding and a photopolymerization initiator has been also proposed (see JP-A-2002-12665).

These processes facilitate the formation of relief patterns after development and make favorable the preservation stability of such compositions. In addition, since a cured relief pattern made of a polybenzoxazole resin has a heat resistance comparable to that of a cured relief pattern made of a polyimide resin, the polybenzoxazole resin precursor has received attention as a promising alternative material for an organic solvent-developable polyimide resin precursor.

Meanwhile, there have been marked changes in methods for packaging semiconductor devices in which the above-described materials are used. In place of a conventional LOC package in which a lead frames is jointed to a semiconductor device through a gold wire, there has tended to be used, in recent years, a package which adopts multilayer wiring in view of an improvement in integration density and function and the miniaturization of a chip. Thus, conditions to which a polyimide resin coating film or a polybenzoxazole resin coating film is exposed during the formation of the structure vary more than before, which requires greater chemical resistance e.g. to a photoresist peeling solution composed of a strong acid, strong base, or organic solvent such as dimethyl sulfoxide, a basic organic compound such as ethanolamine or tetramethylammonium hydroxide, and the like.

For a similar reason, a method for mounting a semiconductor device on a printed wiring board is being also changed from a conventional method using a metal pin and a lead-tin eutectic solder into a method using, with a view towards a chip size package, a structure enabling higher-density mounting such as BGA (ball grid array) in which a polyimide resin coating film or a polybenzoxazole resin coating film is directly contacted with a solder bump.

In other words, the polyimide resin coating film and the polybenzoxazole resin coating film have become required Lo have increased resistance to heat and to flux because there occurs a state where they contact the flux e.g. in the reflow process of the solder bump.

The polybenzoxazole resin coating film is generally prepared by subjecting a bisaminophenol compound and a dicarboxylic acid compound to polycondensation to produce a polybenzoxazole resin precursor which is then dissolved in an organic solvent to make a varnish-like composition, followed by forming a coating film e.g. through coating before further heating to high temperature to convert to a polybenzoxazole resin.

Specific examples of proposed polybenzoxazole resins designed to satisfy heat resistance, chemical resistance, and high-temperature flux resistance include polybenzoxazole resins obtained by heat curing polybenzoxazole resin precursors synthesized from 4,4'-diamino-3,3'-dihydroxybiphenyl and terephthalic acid, from 4,4'-diamino-3,3'-dihydroxybiphenyl and 4,4'-biphenyldicarboxylic acid, from 2,2-bis(3-amino-4-hydroxyphenyl)hexafluoropropane and terephthalic acid, and from 2,2-bis(3-amino-4-hydroxyphenyl)hexafluoropropane and 4,4'-biphenyldicarboxylic acid.

A dicarboxylic acid such as terephthalic acid or 4,4'-biphenyldicarboxylic acid can be used as described above to make the polybenzoxazole resin in the form of a polymer having a rigid skeleton to improve the heat resistance thereof. Meanwhile, however, when made in the form of a resin composition having positive photosensitivity by adding an optically active compound such as naphthoquinoneazide, the above-described polybenzoxazole resin precursor having a rigid skeleton has problems that it per se becomes less soluble in an alkali aqueous solution and that it makes difficult the process of lithography using an i-beam stepper because the transmission of the i-beam, an outgoing light from a mercury lamp, is significantly reduced. There is also a problem that the reduced solubility thereof in an organic solvent makes it difficult to produce the photosensitive resin composition itself (see JP-A-2003-105086).

In contrast, a polybenzoxazole resin precursor using 2,2-bis(3-amino-4-hydroxyphenyl)hexafluoropropane and isophthalic acid or diphenyl ether dicarboxylic acid is excellent in i-beam transmission and easy to process into various shapes because it is highly soluble in an organic solvent. However, a polybenzoxazole resin obtained by curing the precursor has a problem that the heat resistance, chemical resistance, and flux resistance thereof are lower than those of the above-described polybenzoxazole resin having a rigid skeleton (see JP-A-2003-105086).

JP-A-05-27245 discloses a composition containing a polyamide resin obtained by using an acid component of a specified structure such as 5-hydroxyisophthalic acid dodecanoate chloride and an acid component of a specified structure such as terephthalic acid in a certain molar ratio to react a diamine component such as diaminodiphenyl ether therewith. However, the composition disclosed in the document has been developed for use in a liquid crystal alignment layer per se, and has not been intended to be developed as a precursor of heat resistant resin excellent not only in solubility in an organic solvent but also in chemical resistance.

Then, there is a need for a polybenzoxazole resin precursor having increased solubility in an organic solvent wherein the heat curing thereof provide a polybenzoxazole resin which satisfies heat resistance, chemical resistance, and flux resistance at a high level.

Patent Document 1: JP-B-01-46862
Patent Document 2: JP-A-2002-12665
Patent Document 3: JP-A-2003-105086
Patent Document 4: JP-A-05-27245

DISCLOSURE OF INVENTION

Problem to be Solved by the Invention

An object of the present invention is to provide a polybenzoxazole resin precursor giving a resin excellent in heat resistance, chemical resistance, and flux resistance through heat curing reaction, and a composition containing the precursor Another object of the present invention is to provide a resin composition having positive photosensitivity, which gives a heat-resistant resin excellent in heat resistance, chemical resistance, and flux resistance after the above-described heat curing, is capable of attaining lithography using an aligner, and has increased solubility in an organic solvent. A further object of the present invention is to provide a process for producing a cured relief pattern excellent in heat resistance, chemical resistance, and flux resistance which consists of the above-described composition, and a semiconductor device having the cured relief pattern.

Means for Solving the Problem

As a result of studies to solve the above-described problems, the present inventors have found that a hydroxypolyamide having a 5-aminoisophthalic acid derivative copolymerized in the main chain structure thereof, and a composition containing the hydroxypolyamide can satisfy the object of the present invention, thereby accomplishing the present invention.

Thus, the present invention is as follows.

1. A hydroxypolyamide having a structure represented by the general formula (1):

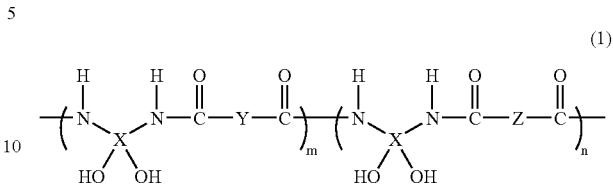

wherein m and n are integers satisfying $m>0$, $n \geq 0$, $2 \leq m+n \leq 1{,}000$, and $0.05 \leq m/(m+n) \leq 1$, and the recurring units may be arranged blockwise or randomly; X represents at least one tetravalent organic group selected from groups represented by the following formula (2); Y represents 5-aminoisophthalic acid having at least one hydrogen atom of the amino group substituted, from which a carboxylic acid group is excluded; and Z represents at least one divalent group selected from groups represented by the following formula (4),

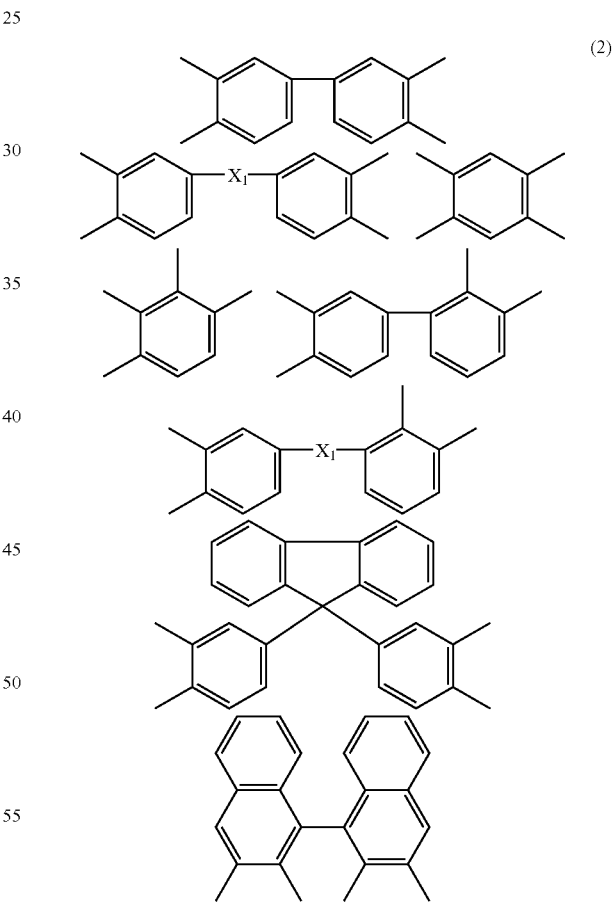

wherein $X_1$ represents a divalent organic group selected from groups represented by the following formula (5); and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group,

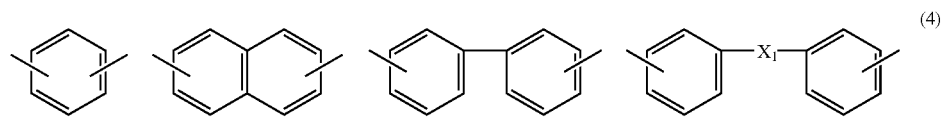

(4)

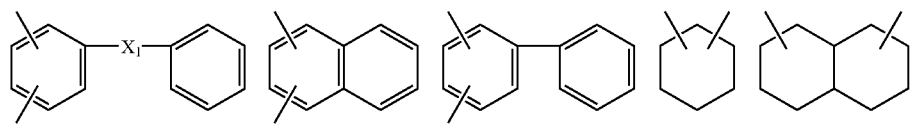

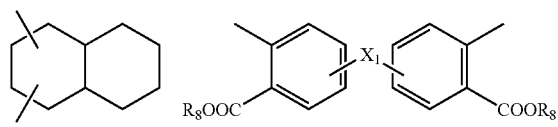

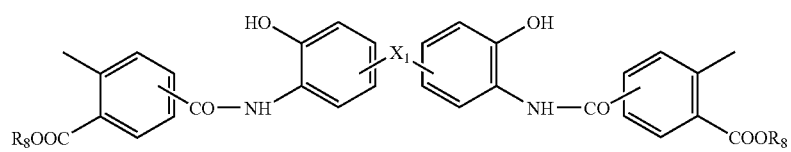

wherein $R_8$ represents a monovalent organic group; $X_1$ represents a divalent organic group selected from groups represented by the following formula (5); and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group, and (5)

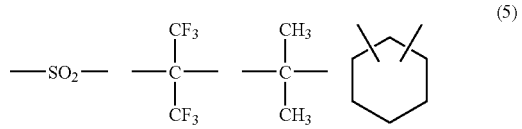

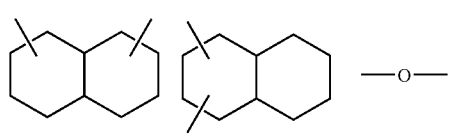

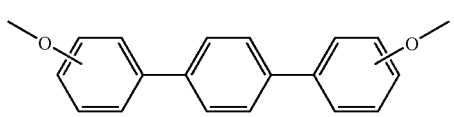

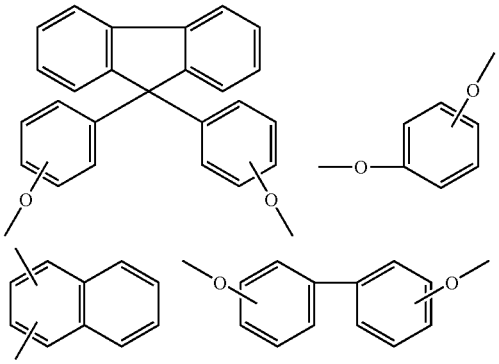

wherein the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group.

2. The hydroxypolyamide described in item 1 above wherein Y represents at least one divalent organic group selected from groups represented by the following formula (3):

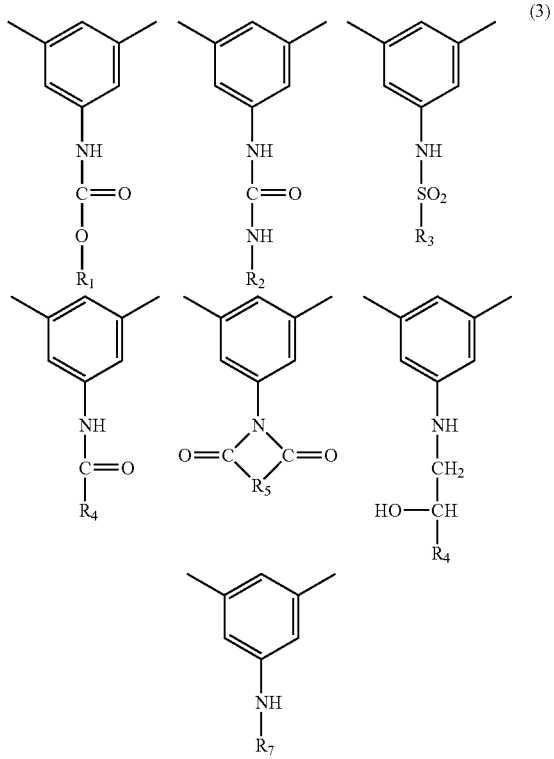

wherein $R_1$, $R_2$, $R_3$, $R_4$, and $R_6$ are each independently a monovalent organic group; $R_5$ is a divalent organic group; $R_7$ is at least one group selected from the group consisting of an aralkyl group, an arylsulfenyl group, a diarylphosphinyl group, and a tri-substituted silyl group; and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group.

3. A resin composition comprising 100 parts by mass of the hydroxypolyamide described in item 1 or 2 above (A) and 70 to 900 parts by mass of an organic solvent (D).

4. A resin composition comprising 100 parts by mass of the hydroxypolyamide described in item 1 or 2 above (A), 1 to 50 parts by mass of a crosslinking agent (B), and 70 to 900 parts by mass of an organic solvent (D).

5. A resin composition comprising 100 parts by mass of the hydroxypolyamide described in item 1 or 2 above (A), 1 to 100 parts by mass of an optically active compound with a naphtoquinonediazide group (C), and 70 to 900 parts by mass of an organic solvent (D), and having positive photosensitivity.

6. A resin composition comprising 100 parts by mass of the hydroxypolyamide described in item 1 or 2 above (A), 1 to 50 parts by mass of a crosslinking agent (B), 1 to 100 parts by mass of an optically active compound with a naphtoquinonediazide group (C), and 70 to 900 parts by mass of an organic solvent (D), and having positive photosensitivity.

7. The resin composition described in item 4 or 6 above wherein the crosslinking agent (B) is an acrylate compound.

8. The resin composition described in item 4 or 6 above wherein the crosslinking agent (B) is an epoxy compound.

9. A process for producing a cured relief pattern, comprising the steps of: applying the resin composition described in item 5 or 6 above onto a substrate; exposing the resultant coating film to an active light through a mask or directly irradiating the coating film with actinic rays; eluting and removing the part exposed or irradiated with the actinic rays using a developer; and heating the resultant positive relief pattern at 150 to 400° C.

10. A semiconductor device having a layer made of a cured relief pattern obtained by the production process described in item 9 above.

Advantages of the Invention

The hydroxypolyamide of the present invention can be used as a precursor of a polybenzoxazole resin excellent in heat resistance, chemical resistance, and flux resistance.

The resin composition of the present invention can be applied and heated to form a polybenzoxazole resin coating film excellent in heat resistance, chemical resistance, and flux resistance in addition, when used in the form of a positive photosensitive resin composition by adding an optically active compound having a naphthoquinonediazide group, the resin composition of the present invention has advantages that it is capable of attaining lithography using an aligner and exhibits excellent solubility in an organic solvent, and the polybenzoxazole resin after heat curing is excellent in heat resistance, chemical resistance, and flux resistance.

The process for producing a cured relief pattern according to the present invention enables the easy production of a cured relief pattern made of a polybenzoxazole resin excellent in heat resistance, chemical resistance, and flux resistance.

The semiconductor device of the present invention may provide a semiconductor device having a cured relief pattern excellent in heat resistance, chemical resistance, and flux resistance in the form of an interlayer insulating film or a surface protective film.

BEST MODE FOR CARRYING OUT THE INVENTION

The present invention is more specifically described below.

<The Hydroxypolyamide and Resin Composition>

Each component comprising the resin composition of the present invention is specifically described below.

(A) The Hydroxypolyamide

The hydroxypolyamide of the present invention has the recurring units represented by the following formula (1). The hydroxypolyamide may be obtained from a mixture of a bisaminophenol compound to be described, $(OH)_2(NH_2)_2$, and a dicarboxylic acid to be described, $Y(COOH)_2$, or a mixture of the bisaminophenol compound $(OH)_2(NH_2)_2$, the dicarboxylic acid $Y(COOH)_2$, and a dicarboxylic acid to be described, $Z(COOH)_2$, using an acid chloride method, an activated ester method, or a well-known amidation reaction such as a condensation reaction in the presence of a dehydrating condensation agent (e.g. polyphosphoric acid or dicyclohexylcarbodiimide).

(1)

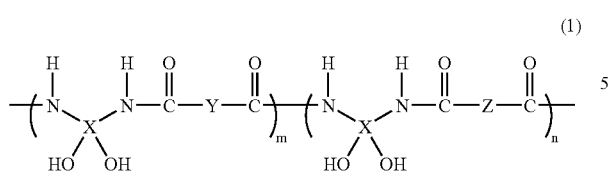

wherein m and n are integers satisfying m>0, n≧0, 2≦m+n≦1,000, and 0.05≦m/(m+n)≦1, and the recurring units may be arranged blockwise or randomly; X represents at least one tetravalent organic group selected from groups represented by the following formula (2); Y represents 5-aminoisophthalic acid having at least one hydrogen atom of the amino group substituted, from which a carboxylic acid group is excluded; and Z represents at least one divalent group selected from groups represented by the following formula (4).

(2)

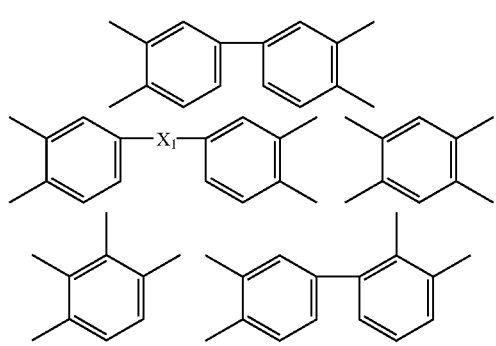

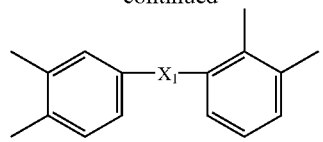

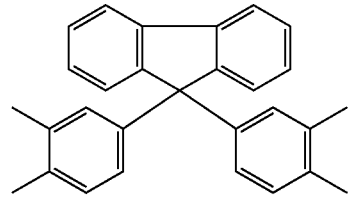

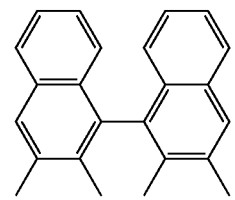

wherein $X_1$ represents a divalent organic group selected from groups represented by the following formula (5); and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group.

(4)

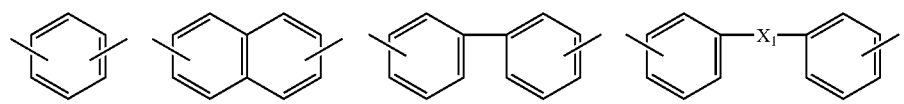

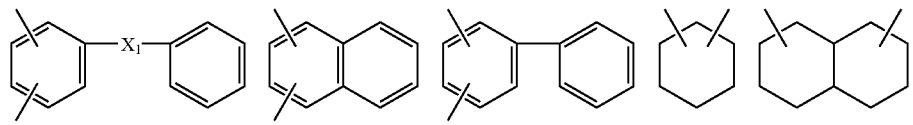

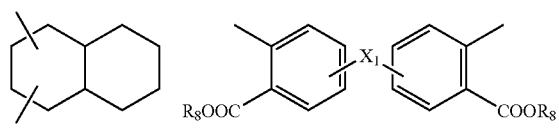

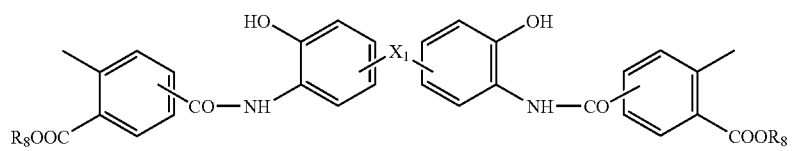

wherein $R_8$ represents a monovalent organic group; $X_1$ represents a divalent organic group selected from groups represented by the following formula (5); and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group.

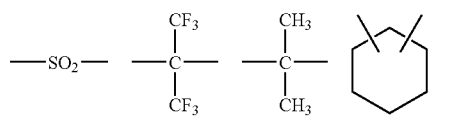

(5)

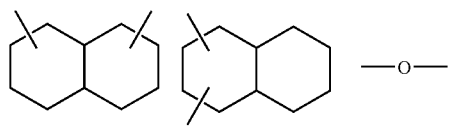

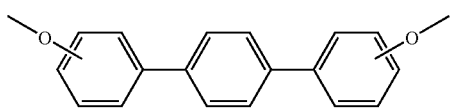

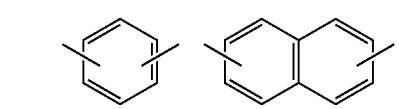

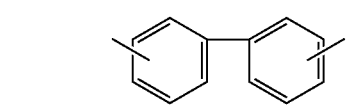

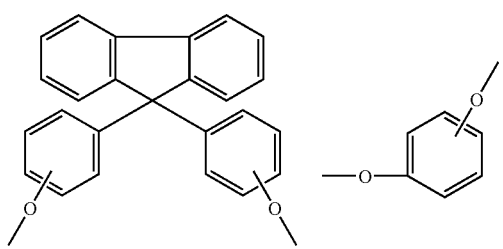

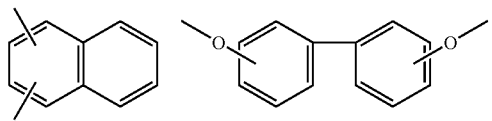

wherein the hydrogen atoms on each aromatic ring may be substituted with at least one group selected from the group consisting of a methyl group, an ethyl group, a propyl group, an isopropyl group, an butyl group, an isobutyl group, a t-butyl group, a fluorine atom, and a trifluoromethyl group.

In the above formula (1), Y is preferably at least one divalent organic group selected from groups represented by the following formula (3).

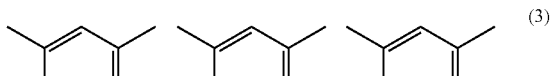

(3)

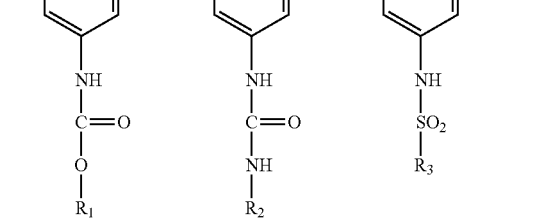

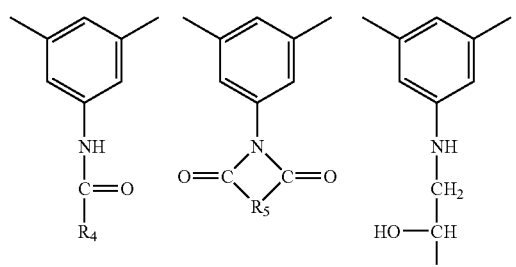

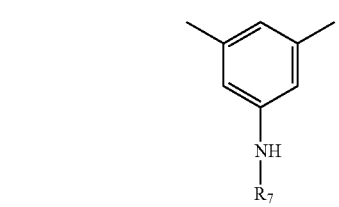

wherein $R_1$, $R_2$, $R_3$, $R_4$, and $R_6$ are each independently a monovalent organic group; $R_5$ is a divalent organic group; $X_2$ represents hydrogen, an alkyl group, or an aromatic group; and the hydrogen atoms on each aromatic ring may be substituted with at least one group selected from the group consisting or a methyl group, an ethyl group, a propyl group, an isopropyl group, a butyl group, an isobutyl group, a t-butyl group, a fluorine atom, and a trifluoromethyl group.

Examples of bisaminophenol compounds having the tetravalent organic group, $X(OH)_2(NH_2)_2$, represented by the above-described formula (2) include 2,4-diaminoresorcinol, 4,6-diaminoresorcinol, 2,2-bis(3-amino-4-hydroxyphenyl) hexafluoropropane, 2,2-bis(4-amino-3-hydroxyphenyl) hexafluoropropane, 2,2-bis(3-amino-4-hydroxyphenyl)propane, 2,2-bis (4-amino-3-hydroxyphenyl)propane, 3,3'-diamino-4,4'-dihydroxydiphenylsulfone, 4,4'-diamino-3,3'-dihydroxydiphenylsulfone, 3,3'-diamino-4,4'-dihydroxybiphenyl, 4,4'-diamino-3,3'-dihydroxybiphenyl, 9,9-bis(4-((4-amino-3-hydroxy)phenoxy)phenyl)fluorene, 9,9-bis(4-(3-amino-4-hydroxy)phenoxy)phenyl)fluorene, 9,9-bis((4-amino-3-hydroxy)phenyl))fluorene, 9,9-bis(3-amino-4-hydroxy)phenyl))fluorene, 3,3'-diamino-4,4'-dihydroxydiphenyl ether, 4,4'-diamino-3,3'-dihydroxyphenyl ether, 2,2-bis(3-amino-4-hydroxy-2-trifluoromethylphenyl)propane, 2,2-bis(4-amino-3-hydroxy-2-trifluoromethylphenyl)propane, 2,2-bis(3-amino-4-hydroxy-5-trifluoromethylphenyl)propane, 2,2-bis(4-amino-3-hydroxy-5-trifluoromethylphenyl)propane, 2,2-bis(3-amino-4-hydroxy-6-trifluoromethylphenyl)propane, 2,2-bis(4-amino-3-hydroxy-6-trifluoromethylphenyl)propane, 2,2-bis(3-amino-4-hydroxy-2-trifluoromethylphenyl)hexafluoropropane, 2,2-bis(4-amino-3-hydroxy-2-trifluoromethylphenyl)hexafluoropropane, 2,2-bis(3-amino-4-hydroxy-5-trifluoromethylphenyl)hexafluoropropane, 2,2-bis(4-amino-3-hydroxy-5-trifluoromethylphenyl)hexafluoropropane, 2,2-bis(3-amino-4-hydroxy-6-trifluoromethylphenyl)hexafluoropropane, 2,2-bis(4-amino-3-hydroxy-6-trifluoromethylphenyl)hexafluoropropane, 3,3'-diamino-4,4'-dihydroxy-2,2'-bis(trifluoromethyl)biphenyl, 4,4'-diamino-3,3'-dihydroxy-2,2'-bis(trifluoromethyl)biphenyl, 3,3'-diamino-4,4-dihydroxy-5,5'-bis(trifluoromethyl)biphenyl, 4,4-diamino-3,3'-dihydroxy-5,5'-bis(trifluoromethyl)biphenyl, 3,3'-diamino-4,4'-dihydroxy-6,6'-bis(trifluoromethyl)biphenyl and 4,4'-diamino-3,3'-dihydroxy-6,6'-bis(trifluoromethyl)biphenyl.

In producing the hydroxypolyamide of the present invention, the bisaminophenol compounds $X(OH)_2(NH_2)_2$ may be used alone or in a combination of two or more.

The dicarboxylic acids having a divalent organic group $Y(COOH)_2$ are specifically 5-aminoisophthalic acid derivatives. The derivatives are compounds each of which consists of 5-aminoisophthalic acid whose amino group has at least one hydrogen atom substituted with a heat crosslinking group, a protecting group, or a dicarboxylic acid anhydride group having no polymerizable unsaturated bonding, and can be divided into the following three series according to the behavior thereof when heated.

The first series of derivatives are compounds each of which consists of 5-aminoisophthalic acid whose amino group has a heat crosslinking group introduced by reacting the amino group thereof e.g. with an acid anhydride, acid chloride, isocyanate, or epoxy compound having a heat crosslinking group.

The above-described heat crosslinking group is preferably that causing a self-crosslinking reaction or a crosslinking reaction with a phenol compound at 150° C. to 400° C., and preferred examples thereof include a norbornene group, a glycidyl group, a cyclohexene group, an ethynyl group, an allyl group, a vinyl group, an aldehyde group, a benzocyclobutene group, a furyl group, a furfuryl group, a dimethoxydimethylamino group, a dihydroxydimethylamino group, an alkynyl group, an alkenyl group, an oxetane group, a methacrylate group, an acrylate group, a cyano group, a thiophene group, and a maleimide group.

The acid anhydride having the heat crosslinking group is preferably an acid anhydride having unsaturated double or triple bonding, and more preferably a 4C to 12C acid anhydride having a cyclic or non-cyclic alkenyl group or a 4C to 12C acid anhydride having a cyclic or non-cyclic alkynyl group. Specific examples thereof include 5-norbornene-2,3-dicarboxylic acid anhydride, exo-3,6-epoxy-1,2,3,6-tetrahydrophthalic acid anhydride, 3-ethynyl-1,2-phthalic acid anhydride, 4-ethynyl-1,2-phthalic acid anhydride, cis-4-cyclohexene-1,2-dicarboxylic acid anhydride, 1-cyclohexene-1,2-dicarboxylic acid anhydride, maleic acid anhydride, citraconic acid anhydride, itaconic acid anhydride, endomethylenetetrahydrophthalic acid anhydride, methylendomethylenetetrahydrophthalic acid anhydride, methyltetrahydrophthalic acid anhydride, and allylsuccinic acid anhydride. These acid anhydrides may be reacted with the amino group of 5-aminoisophthalic acid to synthesize compounds each of which has an organic group having a heat crosslinking group introduced into $R_5$ of formula (3).

The acid chloride having a heat crosslinking group is preferably an acid chloride having unsaturated double or triple bonding, and more preferably a 3C to 11C acid chloride having a cyclic or non-cyclic alkenyl group or a 3C to 11C acid anhydride having a cyclic or non-cyclic alkynyl group. Specific examples thereof include 3-cyclohexene-1-carboxylic acid chloride, 2-furancarboxylic acid chloride, crotonic acid chloride, cinnamic acid chloride, methacrylic acid chloride, acrylic acid chloride, propiolic acid chloride, tetrolic acid chloride, and thiophen-2-acetyl chloride. These acid chlorides may be reacted with the amino group of 5-aminoisophthalic acid to synthesize compounds each of which has an organic group having a heat crosslinking group introduced into $R_4$ of formula (3).

When the acid chloride having the heat crosslinking group is a sulfonyl chloride, the sulfonyl chloride preferably has unsaturated double or triple bonding, and is more preferably a 9C to 11C arylsulfonyl chloride substituted with an alkenyl group. Specific examples thereof include p-styrenesulfonyl chloride. These sulfonyl chlorides may be reacted with the amino group of 5-aminoisophthalic acid to synthesize compounds each of which has an organic group having a heat crosslinking group introduced into $R_3$ of formula (3).

The isocyanate having a heat crosslinking group is preferably an isocyanate having unsaturated double or triple bonding, and more preferably a 5C to 15C isocyanate having a cyclic or non-cyclic alkenyl group or a 5C to 15C isocyanate having a cyclic or non-cyclic alkynyl group. Specific examples thereof include 3-isopropenyl-α,α-dimethylbenzyl isocyanate and methacryloyloxyethyl isocyanate. These isocyanates may be reacted with the amino group of 5-aminoisophthalic acid to synthesize compounds each of which has an organic group having a heat crosslinking group introduced into $R_2$ of formula (3).

The epoxy compound having a heat crosslinking group is preferably an epoxy compound having unsaturated double or triple bonding, and more preferably a 5C to 15C epoxy compound having a cyclic or non-cyclic alkenyl group or a 5C to 15C epoxy compound having a cyclic or non-cyclic alkynyl group. Specific examples thereof include glycidyl methacrylate and allyl glycidyl ether. These epoxy compounds may be reacted with the amino group of 5-aminoisophthalic acid to synthesize compounds each of which has an organic group having a heat crosslinking group introduced into $R_6$ of formula (3).

The second series of derivatives are compounds each of which consists of 5-aminoisophthalic acid whose amino group is protected with a generally known eliminatable protective group for an amino group, for example, a urethane-type (alkoxycarbonyl-type) protective group, an acyl-type protective group, an aralkyl-type protective group, a silicone-type protective group, a urea-type protective group, a sulfonyl-type protective group, a sulfenyl-type protective group, or a phosphinyl-type protective group. As these protective groups are selected those each of which is eliminated in the step of cyclizing the polybenzoxazole precursor by heating to reproduce the amino group. The reproduced amino group causes a crosslinking reaction with part or terminal portion of the main chain of the hydroxypolyamide.

Examples of the urethane-type protective group include C2 to C7 alkoxycarbonyl groups such as methoxycarbonyl, ethoxycarbonyl, propoxycarbonyl, isobutoxycarbonyl, t-butoxycarbonyl, methoxyacetyl, and trichloroethyloxycarbonyl, and C8 to C25 aralkyloxycarbonyl groups such as benzyloxycarbonyl, p-nitrobenzyloxycarbonyl, p-methoxybenzyloxycarbonyl, isobornylbenzyloxycarbonyl, and p-biphenylisopropylbenzyloxycarbonyl.

Specific examples of a compound used for protecting the amino group of 5-aminoisophthalic acid with the urethane-type protective group include chloroformates such as methyl chloroformate, ethyl chloroformate, n-propyl chloroformate, isopropyl chloroformate, isobutyl chloroformate, 2-ethoxyethyl chloroformate, sec-butyl chloroformate, benzyl chloroformate, 2-ethylhexyl chloroformate, allyl chloroformate, phenyl chloroformate, 2,2,2-trichloroethyl chloroformate, 2-butoxyethyl chloroformate, p-nitrobenzyl chloroformate, p-methoxybenzyl chloroformate, isobornylbenzyl chloroformate, and p-biphenylisopropylbenzyl chloroformate, and t-butoxycarbonylation agents such as 2-t-butoxycarbonyloxyimino-2-phenylacetonitrile, S-t-butoxycarbonyl-4,6-dimethyl-thiopyrimidine, and di-t-butyl-dicarbonate. These compounds may be reacted with the amino group of 5-aminoisophthalic acid to synthesize compounds each of which has an alkyl group or an aralkyl group introduced into $R_1$ of formula (3).

Examples of the acyl-type protective group include 1C to 5C alkoxycarbonyl groups such as a formyl group, a phthaloyl group, and groups to form 2C to 12C cyclic imide compounds such as a dithiasuccinoyl group.

Specific examples of a compound used for protecting the amino group of 5-aminoisophthalic acid with the acyl-type protective group include N-ethoxycarbonylphthalimide, ethyldithiocarbonyl chloride, formic acid chloride, benzoyl chloride, and acetyl chloride. These compounds may be reacted with the amino group of 5-aminoisophthalic acid to synthesize compounds each of which has an alkyl group or an aralkyl group introduced into $R_4$ of formula (3), or cyclic imide compounds having $R_5$ of formula (3).

Examples of the aralkyl-type protective group include a triphenylmethyl group.

Specific examples of a compound used for protecting the amino group of 5-aminoisophthalic acid with the aralkyl-type protective group include triphenylmethyl chloride (trityl chloride). These compounds may be reacted with the amino group of 5-aminoisophthalic acid to synthesize compounds each of which has an aralkyl group introduced into $R_7$ of formula (3).

The silicone-type protective group is a silyl group tri-substituted with an organic group, and examples thereof include a silyl group tri-substituted with a 1C to 4C alkyl or phenyl group such as a trimethylsilyl group, a triethylsilyl group, a t-butyldimethylsilyl group, or a t-butyldiphenylsilyl group.

Specific examples of a compound used for protecting the amino group of 5-aminoisophthalic acid with the silicone-type protective group include silylation agents such as trimethylchlorosilane, hexamethyldisilazane, N,O-bis(trimethylsilyl)acetamide, bis(trimethylsilyl)trifluoroacetamide, (N,N-dimethylamino)trimethylsilane, (dimethylamino)trimethylsilane, trimethylsilyldiphenylurea, and bis(trimethylsilyl)urea. These compounds may be reacted with the amino group of 5-aminoisophthalic acid to synthesize compounds each of which has a tri-substituted silyl group introduced into $R_7$ of formula (3).

For protecting the amino group of 5-aminoisophthalic acid with the urea-type protective group, 5-aminoisophthalic acid may be reacted with any of various monoisocyanate compounds.

Examples of the monoisocyanate compound include 3C to 20C alkyl isocyanates such as n-butyl isocyanate and n-octadecyl isocyanate and 6C to 12C aryl isocyanates such as phenyl isocyanate and o-tolyl isocyanate. These compounds may be reacted with the amino group of 5-aminoisophthalic acid to synthesize compounds each of which has an alkyl group or an aryl group introduced into $R_2$ of formula (3).

Examples of the sulfonyl-type protective group include 6C to 8C arylsulfonyl groups such as a toluenesulfonyl (tosyl) group and 1C to 5C alkylsulfonyl groups such as a methanesulfonyl(mesyl) group.

Specific examples of a compound used for protecting the amino group of 5-aminoisophthalic acid with the sulfonyl-type protective group include 5C to 8C arylsulfonyl chlorides such as p-toluenesulfonic acid chloride and 1C to 4C alkylsulfonyl chlorides such as methanesulfonic acid chloride. These compounds may be reacted with the amino group of 5-aminoisophthalic acid to synthesize compounds each of which has an alkyl group or an aryl group introduced into $R_3$ of formula (3).

Examples of protective groups other than those described above include 5C to 70 arylsulfenyl groups such as an o-nitrophenylsulfenyl group and an o-nitropyridinesulfenyl group, C10 to C20 diarylphosphinyl groups such as a diphenylphosphinyl group, and a 2-benzoyl-1-methylvinyl group.

The third series of derivatives are compounds each of which consists of 5-aminoisophthalic acid whose amino group has been subjected to imidation by reacting the amino group thereof with a dicarboxylic acid anhydride having no polymerizable unsaturated bonding. The behavior of the derivative during heating is uncertain, but the cross-linking with a phenol part in another hydroxypolyamide molecule is deduced to occur through ester linkage while the imide ring is opened.

Examples of the dicarboxylic acid anhydride having no polymerizable unsaturated bonding include 4C to 12C dicarboxylic acid anhydrides such as o-phthalic acid anhydride, cis-1,2-cyclohexanedicarboxylic acid anhydride, and glutaric acid anhydride. These compounds may be reacted with the amino group of 5-aminoisophthalic acid to synthesize cyclic imide compounds having $R_5$ of formula (3).

According to the present invention, Y is 5-aminoisophthalic acid having at least one hydrogen atom of the amino group substituted, from which a carboxylic acid group is excluded, and is preferably a divalent organic group represented by the above-described formula (3), and more preferably at least one divalent organic group selected from the group consisting of the above-described divalent organic group substituted with a urethane-type protective group having $R_1$, the above-described divalent organic group substituted with a urea-type protective group having $R_2$, the above-described divalent organic group substituted with a sulfonyl-type protective group having $R_3$, the above-described divalent organic group substituted with a heat crosslinking group having $R_4$ containing unsaturated double or triple bonding, the above-described divalent organic group substituted with a heat crosslinking group having $R_5$ containing unsaturated double or triple bonding, and the above-described divalent organic group substituted with a dicarboxylic acid anhydride group having $R_5$ containing no polymerizable unsaturated bonding.

In producing a hydroxypolyamide which is a component of the resin composition of the present invention, the dicarboxylic acids $Y(COOH)_2$ may be used alone or in a combination of two or more.

Examples of the dicarboxylic acid $Z(COOH)_2$ having a divalent organic group represented by the formula (4) include isophthalic acid, 3,4'-biphenyldicarboxylic acid, 3,3'-biphenyldicarboxylic acid, 1,4-naphthalenedicarboxylic acid, 2,3-naphthalenedicarboxylic acid, 1,5-naphthalenedicarboxylic acid, 2,6-naphthalenedicarboxylic acid, 4,4'-sulfonylbisbenzoic acid, 3,4'-sulfonylbisbenzoic acid, 3,3'-sulfonylbisbenzoic acid, 4,4'-oxybisbenzoic acid, 3,4'-oxybisbenzoic acid, 3,3'-oxybisbenzoic acid, 2,2-bis(4-carboxyphenyl)propane, 2,2-bis(3-carboxyphenyl)propane, 2,2-bis(4-carboxyphenyl) hexafluoropropane, 2,2-bis(3-carboxyphenyl)hexafluoropropane, 2,2'-dimethyl-4,4'-biphenyldicarboxylic acid, 3,3'-dimethyl-4,4'-biphenyldicarboxylic acid, 2,2'-dimethyl-3,3'-biphenyldicarboxylic acid, 2,2-bis(trifluoromethyl)-4,4'-biphenyldicarboxylic acid, 3,3'-bis(trifluoromethyl)-4,4'-biphenyldicarboxylic acid, 2,2'-bis(trifluoromethyl)-3,3'-biphenyldicarboxylic acid, 9,9-bis(4-(4-carboxyphenoxy)phenyl)fluorene, 9,9-bis(4-(3-carboxyphenoxy)phenyl)fluorene, 4,4'-bis(4-carboxyphenoxy)biphenyl, 4,4'-bis(3-carboxyphenoxy)biphenyl, 3,4'-bis(4-carboxyphenoxy)biphenyl, 3,4'-bis(3-carboxyphenoxy)biphenyl, 3,3'-bis(4-carboxyphenoxy)biphenyl, 3,3'-bis(3-carboxyphenoxy)biphenyl, 4,4'-bis(4-carboxyphenoxy)-p-terphenyl, 4,4'-bis(4-carboxyphenoxy)-m-terphenyl, 3,4'-bis(4-carboxyphenoxy)-p-terphenyl, 3,3'-bis(4-carboxyphenoxy)-p-terphenyl, 3,4'-bis(4-carboxyphenoxy)-m-terphenyl, 3,3'-bis(4-carboxyphenoxy)-m-terphenyl, 4,4'-bis(3-carboxyphenoxy)-p-terphenyl, 4,4'-bis(3-carboxyphenoxy)-m-terphenyl, 3,4'-bis(3-carboxyphenoxy)-p-terphenyl, 3,3'-bis(3-carboxyphenoxy)-p-terphenyl, 3,4'-bis(3-carboxyphenoxy)-m-terphenyl, 3,3'-bis(3-carboxyphenoxy)-m-terphenyl, 3-fluoroisophthalic acid, 2-fluoroisophthalic acid, 2-fluoroterephthalic acid, 2,4,5,6-tetrafluoroisophthalic acid, 2,3,5,6-tetrafluoroterephthalic acid, 5-trifluoromethylisophthalic acid, 4-ethynylisophthalic acid and 5-ethynylisophthalic acid.

In addition, a tetracarboxylic acid dianhydride may be also ring-opened e.g. with a monoalcohol or a monoamine to make the above-described dicarboxylic acid $Z(COOH)_2$ for use. Here, examples of the monoalcohol include C1 to C5 alkyl alcohols such as methanol, ethanol, propanol, isopropanol, butanol, and t-butanol, and C6 to C19 aralkyl alcohols such as benzyl alcohol, and examples of the monoamine include C1 to C5 alkylamines such as butylamine, and C5 to C12 arylamines such as aniline. In an alternative process, a tetracarboxylic acid dianhydride may be also reacted with a bisaminophenol or a diamine, followed by subjecting the generated carboxylic acid residue to esterification or amidation using the above-described monoalcohol or monoamine.

Further, one mole of bisaminophenol may be also reacted with two moles of trimellitic acid chloride anhydride to produce a tetracarboxylic acid dianhydride, which is then ring-opened in the same way as that for the above-described tetracarboxylic acid dianhydride to make the above-described dicarboxylic acid $Z(COOH)_2$ for used In producing the hydroxypolyamide of the present invention, the dicarboxylic acids $Z(COOH)_2$ may be used alone or in a combination of two or more. However, as described above, polybenzoxazole resin precursors having rigid skeletons such as terephthalic acid and 4,4''-biphenyldicarboxylic acid are disadvantageously used alone as $Z(COOH)_2$ because they per se have reduced solubilities in an alkali aqueous solution and an organic solvent and the transmission of the i-beam, an outgoing light from a mercury lamp, is decreased.

Further, in the hydroxypolyamide of the present invention, it is also preferable that the terminal group thereof is capped with a particular organic group. Examples of the capping group include organic groups as described in JP-A-05-197153. The capping with the group is expected to make favorable the mechanical property and shape of a cured relief pattern after heat curing. Examples of preferred such capping groups are as follows.

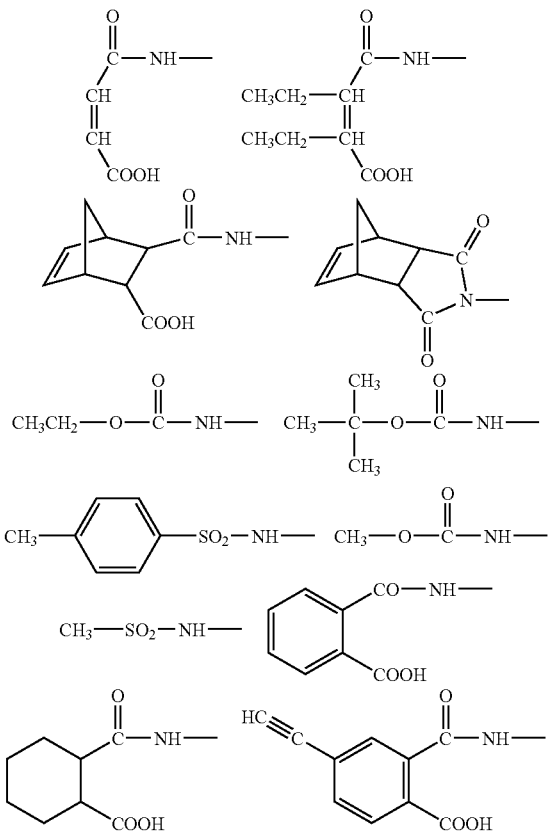

Further, in producing the hydroxypolyamide of the present invention, a diamine other than the above-described bisaminophenol compounds may be subjected to condensation. By way of example, units consisting of a silicon atom-containing diamine and a dicarboxylic acid are condensed. This may improve adhesiveness to a silicon wafer providing a substrate. Examples of preferred such diamines include bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, and bis(γ-aminopropyl)tetraphenyldisiloxane.

When units containing a diamine other than the above-described bisaminophenol compounds are condensed, the amount of the bisaminophenol compound is preferably 70 to 100 mole %, more preferably 80 to 100 mole % based on the total diamine.

A process for producing the hydroxypolyamide of the present invention will be described using an acid chloride process as an example.

In the acid chloride process, the acid chloride used is first obtained by reacting a dicarboxylic acid with an excess of thionyl chloride in the presence of a catalyst such as N,N-dimethylformamide or pyridine before distilling off excess thionyl chloride under heating and reduced pressure, followed by recrystallizing the residue with a solvent such as hexane or toluene. The acid chloride thus obtained may be used after isolation, or may be directly employed without isolation. The dicarboxylic acid chloride thus produced may be dissolved together with a bisaminophenol compound usually in a polar solvent such as N-methyl-2-pyrrolidone or N,N-dimethylacetamide, followed by reaction at room temperature to −30° C. in the presence of an acid acceptor such as triethylamine or pyridine to provide a hydroxypolyamide.

Recurring units in the hydroxypolyamide obtained using at least one kind of the above-described bisaminophenol compound $X(OH)_2(NH_2)_2$ and at least one kind of the above-described dicarboxylic acid $Y(COOH)_2$ may be arranged blockwise or randomly. A recurring unit derived from the dicarboxylic acid $Y(COOH)_2$ and a recurring unit derived from the $Z(COOH)_2$ may be arranged blockwise or randomly.

In such case, when two or more of bisaminophenol compounds or two or more of dicarboxylic acids are simultaneously added to a reaction solution, the recurring units are arranged at random. On the other hand, when two or more of bisaminophenol compounds or two or more of dicarboxylic acids are added with a time difference to a reaction solution, or a hydroxypolyamide obtained by the reaction of one kind of bisaminophenol compound and one kind of dicarboxylic acid and a hydroxypolyamide obtained by the reaction using another kind for at least one of the bisaminophenol compound and the dicarboxylic acid are condensed, the recurring units are arranged blockwise.

The hydroxypolyamide of the present invention is characterized in that the heating thereof produces a crosslinking reaction as well as a reaction to convert into oxazole. Thus, a polybenzoxazole resin which is partially crosslinked in the part of 5-aminoisophthalic acid may be obtained.

In the structure represented by the formula (1) above, m and n are integers totaling from 2 to 1,000, preferably from 5 to 100. Here, a total of m and n of more than 1,000 is unfavorable because it becomes less soluble in an organic solvent and extremely difficult to handle. Less than 2 is also unfavorable because sufficient physical properties can not be achieved.

In addition, m and n are integers satisfying $0.05 \leq (m/(m+n)) \leq 1$, preferably $0.1 \leq m/(m+n) \leq 1$. A value of $(m/(m+n))$ of less than 0.05 becomes less effective in improving heat resistance and chemical resistance because of reduced crosslink density.

(B) Crosslinking Agents

In the composition of the present invention, a crosslinking agent may be used. The crosslinking agent refers to a compound causing a crosslinking reaction by heat, and examples thereof include an acrylate compound, an epoxy compound, a methylol compound, and an amino resin. An acrylate compound and an epoxy compound are preferable, and an acrylate compound is more preferable.

The acrylate compound refers to a compound having, in the molecule, a group selected from acrylate, methacrylate, acrylamide, methacrylamide, and the like.

Preferred specific examples thereof include methacrylaldehyde, methacrylamide, methacrylic acid, 2-(acetoacetyloxy)ethyl methacrylate, allyl methacrylate, benzyl methacrylate, butyl methacrylate, cyclohexyl methacrylate, 2-diethylaminoethyl methacrylate, dimethylaminoethyl methacrylate, dodecyl methacrylate, 2-ethoxyethyl methacrylate, ethyl methacrylate, 2-ethylhexyl methacrylate, furfuryl methacrylate, hexafluoropropyl methacrylate, hexyl methacrylate, 2-hydroxyethyl methacrylate, propyl methacrylate, methyl methacrylate, octyl methacrylate, stearyl methacrylate, tetrahydrofurfuryl methacrylate, 3-(trimethoxysilyl)propyl methacrylate, vinyl methacrylate, acrolein, acrylamide, 2-acrylamide-2-methylpropanesulfonic acid, acrylic acid, butyl acrylate, cyclohexyl acrylate, ethyl acrylate, hexyl acrylate, hydroxyethyl acrylate, 2-methoxyethyl acrylate, stearyl acrylate, 3-(trimethoxysilyl)propyl acrylate, methoxydiethylene glycol methacrylate, phenoxyethyl acrylate, glycidyl methacrylate, tetraethylene glycol dimethacrylate, tetraethylene glycol dimethacrylate, neopentylglycol diacrylate, neopentylglycol diacrylate, 2-hydroxy-1,3-dimethacryloxypropane, 2-hydroxy-1,3-diacryloxypropane, trimethylolpropane trimethacrylate, trimethylolpropane triacrylate, tetramethylolmethane trimethacrylate, tetramethylolmethane triacrylate, tetramethylolmethane tetramethacrylate, tetramethylolmethane tetraacrylate, dimethylolpropane tetraacrylate, isocyanuric acid EO-modified triacrylate, and biphenol A EO-modified diacrylate.

Further such examples thereof are NK-ester series M-20G, M-40G, M-90G, M-230G, CB-1, SA, S, AMP-10G, AMP-20G, AMP-60G, AM-90G, A-SA, LA, 1G, 2G, 3G, 4G, 9G, 14G, 23G, BG, HD, NPG, 9PG, 701, BPE-100, SPE-200, BPE-500, BPE-1300, A-200, A-400, A-600, A-HD, A-NPG, APG-200, APG-400, APG-700, A-BPE-4, 701A, TMPT, A-TMPT, A-TMM-3, A-TMM-3L, and A-TMMT (all of which are trade names) from Shin-Nakamura Chemical Co., Ltd.

Further such examples thereof are Light-Ester series M. E, NB, IB, EH, ID, L, L-5, L-7, TD, L-8, S, MC, 130MA, 041MA, CH, THF, BZ, PO, IB-X, HO, HOP, HOA, HOP-A, HOB, A, HO-MS, HO-HH, HO-MPP, G, P-1M, P-2M, EG, 2EG, 1.4BG, 1.6HX, 1.9ND, TMP, G-101P, G-201P, BP-2EM, TB, IS, MTG, BO, CL, 3EG, 14EG, 9EG, 14EG, NP, M-3F, M-4F, M-6F, FM-108, 1.3BG, and 1.10DC (all of which are trade names) from Kyoeisha Chemical Co., Ltd.

Further such examples thereof are Light-Acrylate series IAA, L-A, S-A, BO-A, EC-A, MTG-A, 130A, DPM-A, PO-A, P-200A, NP-4EA, NP-8EA, THF-A, IB-XA, HOA, HOP-A, M-600A, HOA-MS, HOA-MPE, 3EG-A, 4EG-A, 9EG-A, 14EG-A, NP-A, 1.6HX-A, 1.9ND-A, DCP-A, BP-4EA, BP-4PA, TMP-A, TMP-6EO-3A, PE-3A, PE-4A, DPE-6A, BA-104, BA-134, and G-201P (all of which are trade names) from Kyoeisha Chemical Co., Ltd.

Further such examples thereof are Epoxy-Ester series M-600A, 40EM, 70PA, 200PA, 80MFA, 3002M, and 3002A (all of which are trade names) from Kyoeisha Chemical Co. Ltd.

Further such examples thereof are Aronix series M-101, M-102, M-110, M-N111, M-113, M-117, M-120, M-208, M-210, M-211, M-215, M-220, M-225, M-233, M-240, M-245, M-260, M-270, M-305, M-309, M-310, M-315, M-320, M-350, M-360, M-400, M-408, M-450, M-5300, M-5400, M-5600, and M-5700 (all of which are trade names) from Toagosei Chemical Industry Co., Ltd.

Further such examples thereof include DMAEA, DMAPAA, DMAA, ACMO, NIPAM, and DEAA (all of which are trade names) from Kohjin Co., Ltd.

Among these acrylate compounds, those each having two or more thermally polymerizable functional groups are particularly preferable.

The epoxy compound refers to a compound having, in the molecule, a group selected from epoxide and cyclohexene oxide.

Preferred specific examples thereof include ethylene glycol diglycidyl ether, diethylene glycol diglycidyl ether, glycerin diglycidyl ether, neopentyl glycol diglycidyl ether, trimethylolpropane triglycidyl ether, and triglycidyl isocyanurate.

Further such examples thereof include Epolight series 40E, 100E, 200E, 400E, 70P, 200P, 400P, 1500NP, 1600, 80MF, 100MF, 4000, and 3002 (all of which are trade names) from Kyoeisha Chemical Co., Ltd.

Among these epoxy compounds, compounds having two or more epoxide groups are particularly preferable.

The methylol compound refers to a phenol derivative having, in the molecule, a methylol group or an alkoxymethyl group. Preferred specific examples thereof include DML-PC, DML-OC, DML-OCHP, and TML-BP from Honshu Chemical Industry Co., Ltd. and 46DMOC, DM-BIOC-F, 26DMPC, DM-BIPC-F, 26DMPCHP, TM-BIP-A, and TMP (all of which are trade names) from Asahi Organic Chemicals Industry Co., Ltd.

The amino resin refers to melamine resin, benzoguanamine resin, urea resin, glycolurea resin, hydroxyethyleneurea resin, and derivatives thereof. Preferred specific examples thereof include Nikalak series MW-30HM, MW-100LM, MX-270, MX-280, and MX-290 from Sanwa Chemical Co., Ltd. and Cymel series 235, 303, 1123, and 1170 (all of which are trade names) from Mitsui Cytech Co., Ltd.

The crosslinking agents described above may be used alone or in a combination of two or more kinds.

In the composition of the present invention, when the crosslinking agent is added, the blending amount thereof is preferably 1 to 50 parts by mass, more preferably 3 to 20 parts by mass based on 100 parts by mass of hydroxypolyamide. A blending amount of less than 1 part by mass has little addition effect. Conversely, more than 50 parts by mass makes poor the stability or lithography characteristics of the composition.

(C) Optically Active Compounds

The resin composition of the present invention can be directly subjected to heat curing for use, but is preferably employed in the form of a resin composition having positive photosensitivity by adding an optically active compound because a relief pattern can be formed.

Preferred optically active compounds thereinafter also referred to as "PAC") include photosensitive diazoquinone compounds. Specifically, they are compounds having a 1,2-benzoquinonediazide or 1,2-naphthoquinonediazide structure, and examples thereof include well-known substances as described e.g. in U.S. Pat. Nos. 2,772,972, 2,797,213, and 3,669,658. Preferred examples of such compounds include the following.

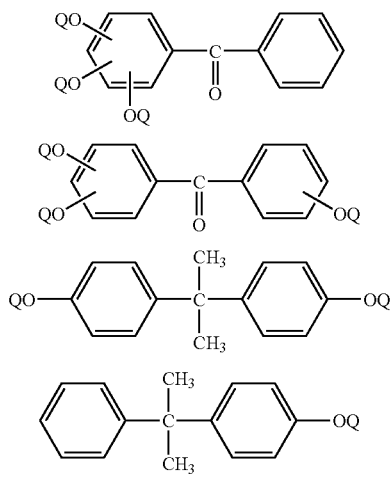

-continued

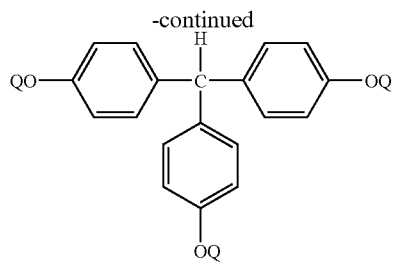

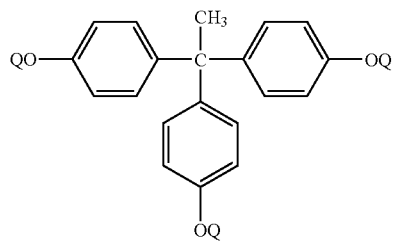

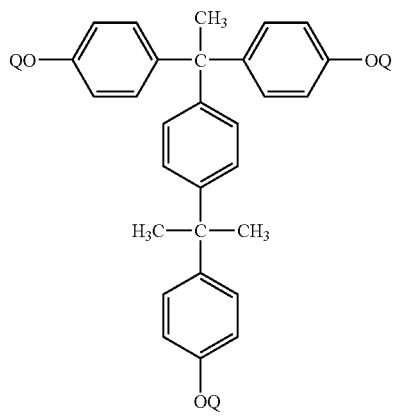

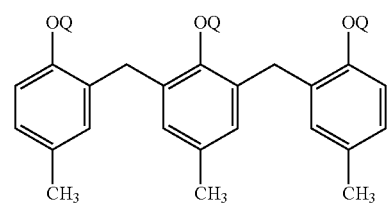

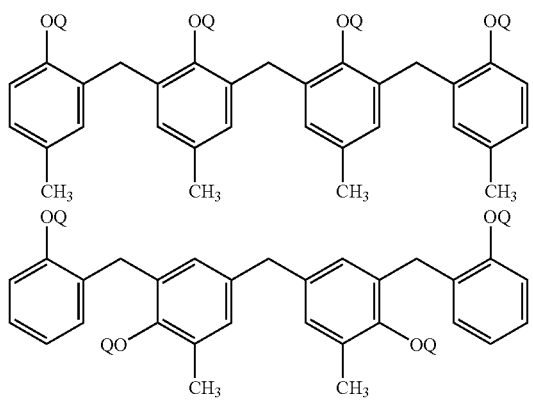

-continued

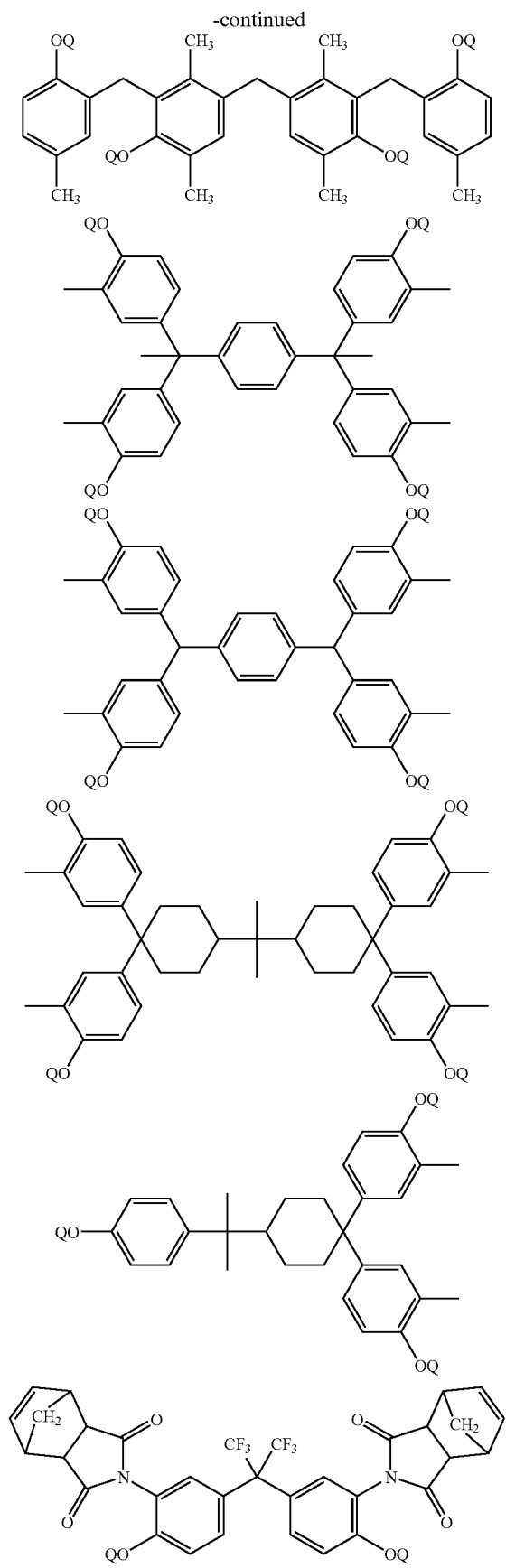

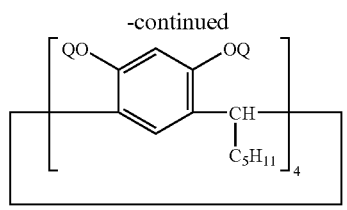

wherein Q is a hydrogen atom or a naphthoquinonediazidesulfonate group, and all Qs are not simultaneously a hydrogen atom.)

The blending amount of PAC in the resin composition of the present invention is preferably 1 to 100 parts by mass, more preferably 5 to 30 parts by mass, based on 100 parts by mass of hydroxypolyamide. A blending amount of PAC of less than one part by mass makes light-patterning properties liable to become poor, and increases coating film reduction during development. Conversely, more than 100 parts by mass generates a residue during development and does not provide a satisfactory pattern.

(D) Organic Solvents

According to the resin composition of the present invention, the hydroxypolyamide is preferably used by dissolving it in an organic solvent to make into varnish form because the application thereof to a substrate can be facilitated.

Examples of such solvents include N-methyl-2-pyrrolidone, cyclopentanone, cyclohexanone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl acetate, methyl-1,3-butylene glycol acetate, 1,3-butylene glycol-3-monomethyl ether, methyl pyruvate, ethyl pyruvate, methyl-3-methoxypropionate, and phenoxyethanol, which may be used alone or in a mixture.

The blending amount of the organic solvent in the resin composition of the present invention is preferably 70 to 900 parts by mass, more preferably 100 to 400 parts by mass, based on 100 parts by mass of hydroxypolyamide.

(E) Other Additives

In the resin composition of the present invention, additives such as a dye, a surfactant, a stabilizer, and a bonding auxiliary for enhancing adhesion to a substrate may be optionally used. In addition, a dissolution-promoting agent can be added to the resin composition having positive photosensitivity of the present invention.

When the above additives are specifically described, the dye may be, for example, methyl violet, crystal violet, or malachite green.

Examples of the surfactant include a non-ionic surfactant consisting of a polyglycol such as polypropylene glycol or polyoxyethylene lauryl ether, or a derivative thereof, a fluorine surfactant such as Florard (trade name, from Sumitomo 3M Ltd.), Megafack (trade name, from Dainippon Ink And Chemicals, Inc.), or Sulfron (trade name, Asahi Glass Co., Ltd.), and an organic siloxane surfactant such as KP341 (trade name, from Shin-Etsu Chemical Co., Ltd.), DBE (trade name, from Chisso Corporation), or Glanol (trade name, from Kyoeisha Chemical Co., Ltd.).

Examples of the bonding auxiliary include alkylimidazolines, butyric acid, polyhydroxystyrene, polyvinyl methyl ether, t-butyl novolac, epoxysilane, epoxy polymer, and various silane coupling agents.

Preferred specific examples of silane coupling agents include a reaction product of a 3-methacryloxypropyltrialkoxysilane, 3-methacryloxypropyldialkoxyalkylsilane, 3-glycidoxypropyltrialkoxysilane, 3-glycidoxypropyldialkoxyalkylsilane, 3-aminopropyltrialkoxysilane, or 3-aminopropyldialkoxyalkylsilane and an acid anhydride or acid dianhydride, and a 3-aminopropyltrialkoxysilane or 3-aminopropyldialkoxyalkylsilane whose amino group is converted to a urethane or urea group. The alkyl group referred to herein may be, for example, a methyl group, an ethyl group, or a butyl group; the acid anhydride may be, for example, maleic acid anhydride or phthalic acid anhydride; the acid dianhydride may be, for example, pyromellitic acid dianhydride, 3,3',4,4'-benzophenonetetracarboxylic acid dianhydride, or 4,4'-oxydiphthalic acid dianhydride; the urethane group may be, for example, a t-butoxycarbonylamino group; and the urea group may be, for example, a phenylaminocarbonylamino group.

The dissolution-promoting agent is preferably a compound having a phenolic hydroxyl group; examples thereof can include bisphenol, linear phenol compounds such as MtrisPC and MLetraPC (trade names, from Honshu Chemical Industry Co., Ltd.), non-linear phenol compounds such as TrisP-HAP, TrisP-PHBA, and TrisP-PA (trade names, from Honshu Chemical Industry Co., Ltd.), diphenylmethanes in each of which the 2 to 5 hydrogen atoms of the phenyl group are substituted with hydroxyl groups, 3,3-diphenylpropanes in each of which the 1 to 5 hydrogen atoms of the phenyl group are substituted with hydroxyl groups, the 1:2 reaction product of 2,2-bis-(3-amino-4-hydroxyphenyl)hexafluoropropane and 5-norbornene-2,3-dicarboxylic acid anhydride, and the 1:2 reaction product of bis-(3-amino-4-hydroxyphenyl)sulfone and 1,2-cyclohexyldicarboxylic acid anhydride.

<A Process for Producing the Cured Relief Pattern and the Semiconductor Device>

A process for producing the cured relief pattern of the present invention uses the above-described resin composition having positive photosensitivity, and the production thereof is carried out using the following steps, The composition is first applied to a semiconductor wafer providing a substrate. A bonding auxiliary such as a silane coupling agent may then be preliminarily applied to the substrate for the purpose of increasing adhesiveness between the composition and the substrate. Examples of a method for the application include spin-coating using a spinner, spray coating using a spray coater, dipping, printing, and roll coating. Among these methods, the spin-coating is preferable because the number of revolutions of the spinner can be changed to easily control film thickness. The coating film thickness of the composition is preferably set so as to provide a thickness of 0.1 to 20 μm after the final curing.

Then, the coating film is dried by prebaking, followed by irradiating an active light in the form of a desired pattern through a mask. The drying temperature is preferably 60 to 135° C. The active light may be, for example, X rays, electron rays, ultraviolet rays, or visible rays, but it preferably has a wavelength of 200 to 500 nm; an i-beam (wavelength: 365 nm) is particularly preferable. A contact aligner or a stepper is typically used as an aligner. Pattern drawing may be directly carried out on the coating film by irradiating with a laser beam of actinic rays.

The irradiated part may be then dissolved and removed using a developer to provide a positive relief pattern.

The developer which may be suitably used here is an aqueous solution of an alkali such as an inorganic alkali (e.g. sodium hydroxide, potassium hydroxide, sodium carbonate, sodium silicate, sodium metasilicate, or aqueous ammonia), a primary amine (e.g. ethylamine or n-propylamine), a secondary amine (e.g. diethylamine or di-n-propylamine), a tertiary amine (e.g. triethylamine or methyldiethylamine), an alcoholamine (e.g. dimethylethanolamine or triethanolamine), or a quaternary ammonium salt (e.g. tetramethylammonium hydroxide or tetraethylammonium hydroxide), or an aqueous solution consisting of the above aqueous solution to which appropriate amounts of an alcohol such as methanol or ethanol and a surfactant are added. Examples of a developing method can include spray, paddle, dipping, and ultrasonic methods. Particularly in the production process of a semiconductor device, a 2.38% aqueous solution of tetramethylammonium hydroxide is often used, and the developing time is preferably within 5 minutes, The positive relief pattern formed by the development is then rinsed; distilled water is preferably used as a rinsing solution.

Subsequently, heating treatment may be carried out at 250 to 400° C. to induce a crosslinking reaction in addition to a cyclodehydration reaction to provide a cured relief pattern made of a polybenzoxazole resin, excellent in heat resistance, chemical resistance, and flux resistance.

By using as a semiconductor-protecting film or an insulating film in the production process of a semiconductor device, the cured relief pattern thus obtained may be suitably employed for producing the semiconductor device.

The present invention will be described based on Examples.

<Synthesis of a Hydroxypolyamide>

EXAMPLE 1

In a one-liter three-neck flask was placed 18.1 g (0.10 mol) of 5-aminoisophthalic acid which was then dissolved in a mixed solvent of 200 g of N-methyl-2-pyrrolidone and 15.8 g (0.20 mol) of pyridine, followed by dropwise adding, to the resultant solution, 11.9 g (0.11 mol) of ethyl chloroformate dissolved in 36 g of γ-butyrolactone before stirring at room temperature for 2 hours. This was cooled to 0° C., to which 35.7 g (0.30 mol) of thionyl chloride dissolved in 105 g of γ-butyrolactone was then added dropwise over a period of 30 minutes so as not to exceed 10° C. The resultant solution was stirred for one hour while cooling with ice in order to avoid exceeding 10° C. before returning to room temperature, followed by distilling off unreacted thionyl chloride and sulfurous acid gas as a byproduct using a vacuum pump. This solution is called reaction solution 1.

To a 0.5-liter Erlenmeyer flask was added 29.5 g (0.10 mol) of 4,4'-oxybisbenzoic acid chloride which was then dissolved in 90 g of γ-butyrolactone. This solution is called reaction solution 2.

In a 2-liter separable flask was placed 80.6 g (0.22 mol) of 2,2-bis(3-amino-4-hydroxyphenyl)hexafluoropropane which was then dissolved in 283 g of dried N-methyl-2-pyrrolidone, to which 31.6 g (0.40 mol) of pyridine was subsequently added, followed by cooling to 0° C. On the other hand, reaction solutions 1 and 2 were transferred to separate dropping funnels, and simultaneously added dropwise to the above-described cooled solution. After the end of the dropwise addition, it was returned to room temperature and stirred for 2 hours. The reaction solution was transferred to a 10-liter beaker, to which 5 liters of distilled water was then added to precipitate the generated polymer. The supernatant solution was removed, and 1.5 liters of tetrahydrofuran was added for redissolution. Further, 5 liters of distilled water was added to precipitate the generated polymer. The supernatant solution was removed, and 1.5 liters of tetrahydrofuran was added for redissolution. This operation was carried out once more, and the solution was then passed through a column packed with an anion exchange resin and cation exchange resin substituted with tetrahydrofuran and added dropwise to 10 liters of distilled water, followed by collecting a precipitate by filtration before vacuum drying at 40° C. for 48 hours to provide a hydroxypolyamide (A-1).

The weight average molecular weight of A-1 expressed in terms of polystyrene was 12,000 (Mw) as determined by gel permeation chromatography (GPC). The analysis conditions of GPC are described below.

Column: Shodex (trade name) 805/804/803 in series, from Showa Denko KK
Eluent: tetrahydrofuran, 40° C.
Flow rate: 1.0 ml/minute
Detector: Shodex (trade name) RI SE-61 from Showa Denko KK

EXAMPLE 2

A hydroxypolyamide (A-2) was obtained just in the same way as that in Example 1 except for the use of 18.1 g (0.11 mol) of 5-norbornene-2,3-dicarboxylic acid anhydride in place of 11.9 g (0.11 mol) of ethyl chloroformate. However, the reaction of 5-aminoisophthalic acid and 5-norbornene-2,3-dicarboxylic acid anhydride took 150 hours at room temperature after the end of the dropwise addition. The weight average molecular weight of A-2 expressed in terms of polystyrene was 14,000 (Mw). The time of reaction termination was confirmed by the peak of the raw materials that has completely disappeared in gel permeation chromatography (GPC). Other Examples were also carried out in the same way. The analysis conditions of GPC are described below.

Column: Shodex (trade name) KFS01/801/802, from Showa Denko KR
Eluent: tetrahydrofuran, 40° C.
Flow rate: 1.0 ml/minute
Detector: UV-975 (trade name) from Nippon Bunko Co.

EXAMPLE 3

A hydroxypolyamide (A-3) was obtained just in the same way as that in Example 1 except for the use of 21.0 g (0.11 mol) of p-toluenesulfonic acid chloride in place of 11.9 g (0.11 mol) of ethyl chloroformate. However, the reaction of 5-aminoisophthalic acid and toluenesulfonic acid chloride took 2 hours at room temperature after the end of the dropwise addition. The weight average molecular weight of A-3 expressed in terms of polystyrene was 15,000 (Mw).

EXAMPLE 4

A hydroxypolyamide (A-4) was obtained just in the same way as that in Example 1 except for the use of 18.9 g (0.11 mol) of 4-ethynyl-1,2-phthalic acid anhydride in place of 11.9 g (0.11 mol) of ethyl chloroformate. However, the reaction of 5-aminoisophthalic acid and 4-ethynyl-1,2-phthalic acid anhydride took 15 hours at room temperature after the end of the dropwise addition. The weight average molecular weight of A-4 expressed in terms of polystyrene was 9,000 (Mw).

EXAMPLE 5

A hydroxypolyamide (A-5) was obtained just in the same way as that in Example 1 except for the use of 16.3 g (0.11 mol) of o-phthalic acid anhydride in place of 11.9 g (0.11 mol) of ethyl chloroformate. However, the reaction of 5-aminoisophthalic acid and o-phthalic acid anhydride took 15 hours at room temperature after the end of the dropwise addition. The weight average molecular weight of A-5 expressed in terms of polystyrene was 10,000 (Mw).

EXAMPLE 6

A hydroxypolyamide (A-6) was obtained just in the same way as that in Example 1 except for the use of 11.5 g (0.11 mol) of crotonic acid chloride in place of 11.9 g (0.11 mol) of ethyl chloroformate. However, the reaction of 5-aminoisophthalic acid and crotonic acid chloride took 2 hours at room temperature after the end of the dropwise addition. The weight average molecular weight of A-6 expressed in terms of polystyrene was 12,000 (Mw).

EXAMPLE 7

A hydroxypolyamide (A-7) was obtained just in the same way as that in Example 1 except for the use of 18.3 g (0.11 mol) of cinnamic acid chloride in place of 11.9 g (0.11 mol) of ethyl chloroformate. However, the reaction of 5-aminoisophthalic acid and cinnamic acid chloride took 2 hours at room temperature after the end of the dropwise addition. The weight average molecular weight of A-7 expressed in terms of polystyrene was 9,000 (Mw).

EXAMPLE 8

A hydroxypolyamide (A-8) was obtained just in the same way as that in Example 1 except for the use of 17.1 g (0.11 mol) of methacryloyloxyethyl isocyanate in place of 11.9 g (0.11 mol) of ethyl chloroformate. However, the reaction of 5-aminoisophthalic acid and methacryloyloxyethyl isocyanate took 2 hours at room temperature after the end of the dropwise addition. The weight average molecular weight of A-8 expressed in terms of polystyrene was 12,000 (Mw).

COMPARATIVE EXAMPLE 1

A hydroxypolyamide (B-1) was obtained just in the same way as that in Example 1 except for changing the addition amount of 4,4'-oxybisbenzoic acid dichloride in reaction solution 2 to 59.0 g (0.20 mol) without preparing reaction solution 1. The weight average molecular weight of B-1 expressed in terms of polystyrene was 13,000 (Mw).

COMPARATIVE EXAMPLE 2

A hydroxypolyamide (B-2) was obtained just in the same way as that in Example 1 except for changing 4,4'-oxybisbenzoic acid dichloride in reaction solution 2 to 37.15 g (0.20 mol) of terephthalic acid dichloride without preparing reaction solution 1. The weight average molecular weight of B-2 expressed in terms of polystyrene was 10,000 (Mw).

<Synthesis of PAC>

REFERENCE EXAMPLE 1

In a 1-L separable flask were placed 109.9 g (0.30 mol) of 2,2-bis(3-amino-4-hydroxyphenyl)-hexafluoropropane, 330 g of tetrahydrofuran (THF), and 47.5 g (0.60 mol) of pyridine, to which 93.6 g (0.57 mol) of 5-norbornene-2,3-dicarboxylic acid anhydride was then added, at room temperature, in the form of powder as it is. A stirring reaction was then conducted at room temperature in the above state for 3 days before confirming the reaction by high performance liquid chromatography (HPLC), resulting in detecting a product with a purity of 94% without detecting any raw material. This reaction solution was directly added dropwise into 1 L of ion exchanged water under stirring before filtering off the precipitate, to which 500 mL of THF was then added for stirring and dissolving, followed by passing the resultant homogeneous solution through a glass column packed with 100 g of a cation exchange resin, Amberlyst 15 (manufactured by Organo CO., Ltd.) to remove the remaining pyridine. Subsequently, this solution was added dropwise into 3 L of ion exchanged water under stirring at high speed to precipitate a product which was then filtered off before vacuum drying.

The imidation of the product was confirmed, by the appearance of characteristic absorptions of the imide group at 1,394 $cm^{-1}$ and 1,774 $cm^{-1}$ and the absence of characteristic absorptions of the amide group near 1,540 $cm^{-1}$ and 1,650 $cm^{-1}$ in the IR spectrum and the absence of peaks of protons of amide and carboxylic acid in the NMR spectrum.

To 560 g of acetone were then added 65.9 g (0.10 mol) of the above-described product and 53.7 g (0.20 mol) of 1,2-naphthoquinonediazide-4-sulfonyl chloride, followed by stirring and dissolving at 20° C. To this solution was dropwise added 21.2 g (0.21 mol) of triethylamine diluted with 106.2 g of acetone at a constant speed over a period of 30 minutes. In this case, the reaction solution was temperature controlled in the range from 20 to 30° C. using an ice-water bath or the like.

After the end of the dropwise addition, the resultant solution was further stirred at 20° C. for 30 minutes and allowed to stand before throwing, thereinto, 5.6 g of a hydrochloric acid aqueous solution having a concentration of 36 wt % at a time, followed by cooling the reaction solution using an ice-water bath and then sucking and filtering off the precipitated solid. The resultant filtrate was added dropwise to 5 L of a hydrochloric acid aqueous solution having a concentration of 0.5 wt % under stirring over a period of one hour to precipitate the desired material which was then recovered by suction filtration. The resultant cake-like recovery material was again dispersed in 5 L of ion-exchanged water, followed by stirring, washing, and recovering by filtering off; this water-washing operation was repeated thrice. The finally obtained cake-like material was vacuum dried at 40° C. for 24 hours to provide a photosensitive diazoquinone compound (Q-2).

<Preparation of a Resin Composition>

In 170 parts by mass of GBL were dissolved 100 parts by mass of each of the hydroxypolyamides (A-1 to A-8 and B-1 and B-2) obtained in Examples 1 to 8 and Comparative Examples 1 and 2 described above, 20 parts by mass of the photosensitive diazoquinone compound (Q-2) obtained in Reference Example 1 described above or a photosensitive diazoquinone compound represented by the following chemical formula (manufactured by Toyo Gosei Co., Ltd.) (Q-1), and 10 parts by mass of each of the crosslinking agents having structures of following formulas C-1 to C-6, which was then filtered through a 0.2-μm filter to prepare each of the resin compositions having positive photosensitivities, of Examples 9 to 35 and Comparative Examples 3 to 8 as shown in Table 1. However, in Comparative Example 8, the composition was gelled and failed to provide a varnish.

TABLE 1

| | Hydroxypoly-amides | Crosslinking agents | Photosensitive diazoquinone compounds |
|---|---|---|---|
| Example 9 | A-1 | None | Q-1 |
| Example 10 | A-2 | None | Q-1 |
| Example 11 | A-3 | None | Q-1 |
| Example 12 | A-4 | None | Q-1 |
| Example 13 | A-5 | None | Q-1 |
| Example 14 | A-1 | C-1 | Q-2 |
| Example 15 | A-1 | C-2 | Q-2 |
| Example 16 | A-1 | C-3 | Q-2 |
| Example 17 | A-1 | C-4 | Q-2 |
| Example 18 | A-1 | C-5 | Q-2 |
| Example 19 | A-1 | C-6 | Q-2 |
| Example 20 | A-2 | C-1 | Q-2 |
| Example 21 | A-2 | C-4 | Q-2 |
| Example 22 | A-3 | C-1 | Q-2 |
| Example 23 | A-3 | C-2 | Q-2 |
| Example 24 | A-3 | C-3 | Q-2 |
| Example 25 | A-3 | C-4 | Q-2 |
| Example 26 | A-4 | C-1 | Q-2 |
| Example 27 | A-4 | C-2 | Q-2 |
| Example 28 | A-5 | C-1 | Q-2 |
| Example 29 | A-1 | C-1 | None |
| Example 30 | A-1 | C-2 | None |
| Example 31 | A-1 | C-4 | None |
| Example 32 | A-2 | C-1 | None |
| Example 33 | A-3 | C-2 | None |
| Example 34 | A-4 | C-2 | None |
| Example 35 | A-5 | C-1 | None |
| Comparative Example 3 | B-1 | C-1 | Q-2 |
| Comparative Example 4 | B-1 | C-2 | Q-2 |
| Comparative Example 5 | B-1 | C-3 | Q-2 |
| Comparative Example 6 | B-1 | C-4 | Q-2 |
| Comparative Example 7 | B-1 | C-1 | None |
| Comparative Example 8 | B-2 | C-1 | Q-2 |

(Q-1) PAC from Toyo Gosei Co., Ltd.

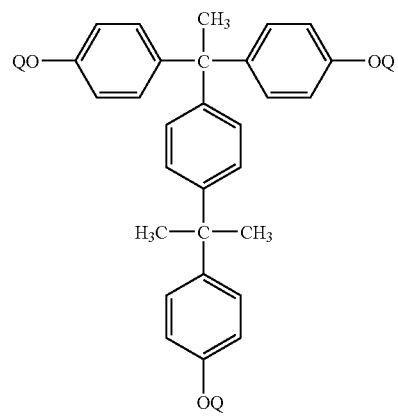

wherein Q is H or

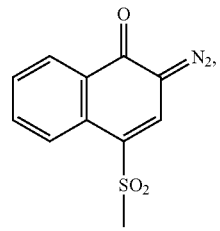

and the proportion of 4-naphthoquinonediazidesulfonate groups in the total number of Qs is 58%.

(C-1) Trimethylolpropane triacrylate

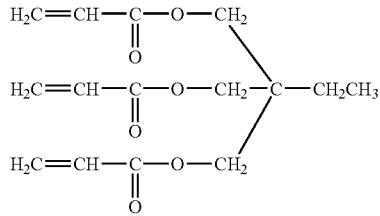

(C-2) Pentaerythritol triacrylate

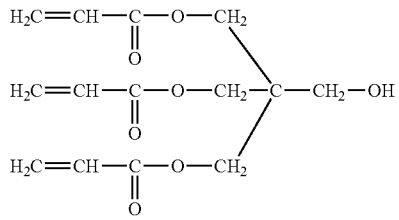

(C-3) Aronix M-315 (isocyanuric acid EO-modified triacrylate) from Toagosei Chemical Industry Co., Ltd.

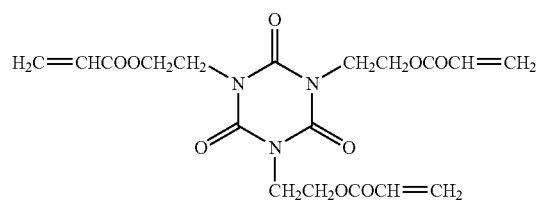

(C-4) Triglycidyl isocyanurate

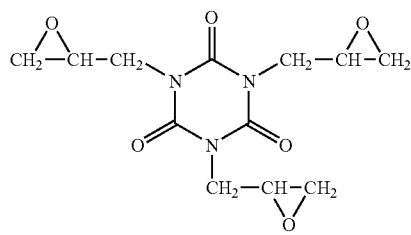

(C-5) Dipentaerythritol pentaacrylate

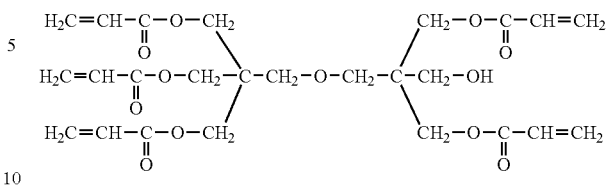

(C-6) Trimethylolpropane trimethacrylate

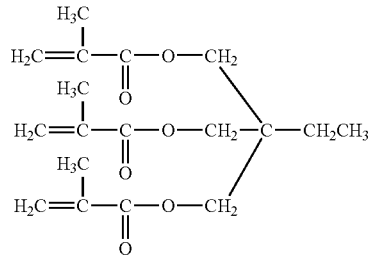

Each of the resin compositions prepared in Examples 9 to 35 and Comparative Examples 3 to 7 was spin coated on a 5-inch silicone wafer providing a substrate using a spin coater (CleanTrack Mark7 (trade name) from Tokyo Electron Ltd., which was then prebaked on a hot plate at 135° C. for 120 seconds. A coating film 6.5 μm in thickness was prepared for evaluating the physical properties and testing the chemical resistance and flux resistance and a coating film 4.5 μm in thickness for evaluating the lithography characteristics. The film thickness was determined using a film thickness measuring apparatus (Lambda Ace) from Dainippon Screen Mfg. Co., Ltd.

In this respect, the resin compositions of Examples 29 to 35 and Comparative Example 7, which contains no photosensitive diazoquinone compounds, were evaluated or tested for physical properties, chemical resistance, and flux resistance, but not evaluated for lithography characteristics.

For physical property evaluation and chemical resistance and flux resistance tests, a wafer having a coating film, which consists of a polybenzoxazole resin, was prepared by heating at 350° C. for one hour under an atmosphere of nitrogen using a heating oven, VF200B (manufactured by Koyo Thermo Systems Co., Ltd.). The coating film on this wafer was used to determine the glass transition temperature and pyrolysis temperature thereof for physical property evaluation. In addition, chemical resistance and flux resistance tests were evaluated. The measurement evaluation method of each characteristic was as follows, and the results are shown in each table.

1. Pyrolysis Temperature

The coating films obtained by curing the resin compositions of Examples and Comparative Examples were treated under the condition of a rate of temperature increase of 10° C./minute at a nitrogen gas flow of 50 ml/minute using a thermal analysis instrument (Model DTG-60A from Shimadzu Corporation); the temperature at which the decrement of the weight reaches 5% was called a 5% weight loss temperature. The determination results are shown in Table 2.

TABLE 2

| | 5% Weight loss temperatures (° C.) | Glass transition temperatures (° C.) |
|---|---|---|
| Example 9 | 485 | 320 |
| Example 10 | 480 | 325 |
| Example 11 | 480 | 320 |
| Example 12 | 480 | 320 |
| Example 13 | 475 | 315 |
| Example 14 | 465 | 320 |
| Example 15 | 460 | 320 |
| Example 16 | 460 | 315 |
| Example 17 | 460 | 330 |
| Example 18 | 465 | 325 |
| Example 19 | 465 | 320 |
| Example 20 | 460 | 320 |
| Example 21 | 465 | 330 |
| Example 22 | 465 | 305 |
| Example 23 | 465 | 310 |
| Example 24 | 460 | 305 |
| Example 25 | 465 | 320 |
| Example 26 | 455 | 300 |
| Example 27 | 455 | 300 |
| Example 28 | 460 | 315 |
| Example 29 | 465 | 315 |
| Example 30 | 460 | 315 |
| Example 31 | 460 | 330 |
| Example 32 | 460 | 320 |
| Example 33 | 460 | 310 |
| Example 34 | 465 | 310 |
| Example 35 | 460 | 315 |
| Comparative Example 3 | 460 | 310 |
| Comparative Example 4 | 460 | 310 |
| Comparative Example 5 | 455 | 305 |
| Comparative Example 6 | 450 | 310 |
| Comparative Example 7 | 460 | 310 |

2. Glass Transition Temperature

The glass transition temperatures (Tg) of the coating films obtained by curing the resin compositions of Examples 9 to 35 and Comparative Examples 3 to 7 were determined using an apparatus for thermomechanical analysis (Model TMA-50 from Shimadzu Corporation). The determination conditions were: sample length 10 mm, constant load 200 g/mm$^2$, measurement temperature range 25° C. to 450° C., rate of temperature increase 10° C./minute, and nitrogen atmosphere. The determination results are shown in Table 2.

3. Chemical Resistance Test

The coating films obtained by curing the resin compositions of Examples and Comparative Examples were prepared on 5-inch wafers by the above-described method, and the film thicknesses (T1) thereof were determined. The wafer was split into pieces about 10 cm square to make a sample for chemical resistance testing.

In a 200-milliliter tall beaker was placed 96 g of dimethylsulfoxide (DMSO) to which 4 g of tetramethylammonium hydroxide pentahydrate (TMAH) was then added to prepare a DMSO/TMAH solution. The solution is heated to 65° C., in which the sample for chemical resistance testing was then dipped for 30 minutes. The sample was then washed with pure water and dried, followed by determining the thickness (T2) of the coating film to calculate the residual film rate (T2/T1× 100) in comparison with T1. In addition, the shape of the coating film after testing was observed for the presence of cracking under an optical microscope.

In place of the above-described DMSO/TMAH solution, a peeling solution (Uresolve SG: methoxyethanol 80%, N-methyl pyrrolidone 15%, potassium hydroxide 5%, from Dynaloy Inc.) was further used, in which the sample was dipped at 80° C. for 20 minutes, followed by similarly observing the residual film rate and the presence of cracking.

The evaluation results are shown in Table 3.

All of the samples of Examples 9 to 35 had satisfactory chemical resistance. In contrast, the samples of Comparative Examples 3 to 7 produced dissolution when Uresolve SG was used.

TABLE 3

| | DMSO/TMAH Chemical resistance | | Uresolve SG Chemical resistance | | Flux resistance test | |
|---|---|---|---|---|---|---|
| | Residual film rate | Crack | Residual film rate | Crack | Residual film rate | Crack |
| Example 9 | 102 | None | 108 | None | 101 | None |
| Example 10 | 100 | None | 110 | None | 100 | None |
| Example 11 | 102 | None | 110 | None | 100 | None |
| Example 12 | 102 | None | 108 | None | 100 | None |
| Example 13 | 103 | None | 112 | None | 104 | None |
| Example 14 | 101 | None | 102 | None | 100 | None |
| Example 15 | 102 | None | 102 | None | 100 | None |
| Example 16 | 101 | None | 103 | None | 100 | None |
| Example 17 | 103 | None | 105 | None | 101 | None |
| Example 18 | 101 | None | 100 | None | 100 | None |
| Example 19 | 101 | None | 102 | None | 100 | None |
| Example 20 | 101 | None | 102 | None | 100 | None |
| Example 21 | 103 | None | 105 | None | 101 | None |
| Example 22 | 101 | None | 102 | None | 100 | None |
| Example 23 | 101 | None | 102 | None | 105 | None |
| Example 24 | 102 | None | 103 | None | 107 | None |
| Example 25 | 102 | None | 105 | None | 107 | None |
| Example 26 | 104 | None | 99 | None | 107 | None |
| Example 27 | 104 | None | 98 | None | 105 | None |
| Example 28 | 102 | None | 102 | None | 100 | None |
| Example 29 | 100 | None | 102 | None | 100 | None |
| Example 30 | 102 | None | 101 | None | 100 | None |
| Example 31 | 102 | None | 105 | None | 102 | None |

TABLE 3-continued

| | DMSO/TMAH Chemical resistance | | Uresolve SG Chemical resistance | | Flux resistance test | |
|---|---|---|---|---|---|---|
| | Residual film rate | Crack | Residual film rate | Crack | Residual film rate | Crack |
| Example 32 | 101 | None | 101 | None | 101 | None |
| Example 33 | 102 | None | 102 | None | 100 | None |
| Example 34 | 104 | None | 100 | None | 106 | None |
| Example 35 | 101 | None | 101 | None | 102 | None |
| Comparative Example 3 | 99 | None | 0 (dissolution) | dissolution | 110 | Some |
| Comparative Example 4 | 95 | None | 70 (dissolution) | dissolution | 110 | Some |
| Comparative Example 5 | 102 | None | 0 (dissolution) | dissolution | 115 | Some |
| Comparative Example 6 | 102 | None | 0 (dissolution) | dissolution | 110 | Some |
| Comparative Example 7 | 100 | None | 0 (dissolution) | dissolution | 110 | Some |

4. Flux Resistance Test

As was the case with the evaluation of the chemical resistance tests, the coating films obtained by curing the resin compositions of Examples and Comparative Examples were prepared on 5-inch wafers by the above-described method, and the film thicknesses (T1) thereof were determined. A flux (Solbond (trade name), product no. R5003 from Alpha Metals Japan Ltd.) was spin coated (at 500 rpm for 20 seconds) on the coating film. This was heated at a peak temperature of 260° C. in an atmosphere of nitrogen for one minute under simulative solder reflow conditions using a mesh belt type continuous baking furnace (Model 6841-20AMC-36 from Koyo Thermo Systems Co., Ltd.).

The coating film after the simulative reflow treatment was dipped and allowed to stand in xylene for 10 minutes and then in 2-propanol for 10 minutes to remove the flux before drying, followed by determining the thickness (T2) of the coating film to calculate the residual film rate (T2/T1×100) in comparison with T1. In addition, observation was carried out under an optical microscope to evaluate the damages of the pattern, mainly the presence of cracking and creasing.

The evaluation results are shown in Table 3.

All of the samples of Examples 9 to 35 had satisfactory flux resistance. In contrast, the films after the evaluation showed the presence of cracking in Comparative Examples 3 to 7.

5. Evaluation of Lithography Characteristics (Light Exposure Limit and Developing Time)

A wafer having a 4.5-μm coating film for evaluation of lithography characteristics was prepared and exposed through a reticle having a test pattern by changing light exposure in stages using an i-beam stepper (NSR2005i8A) from Nikon Corporation exposing with the i-beam (365 nm) from a mercury lamp. This was developed by adjusting the developing time so as to provide a film thickness of 3.8 μm after development under the condition of 23° C. using an alkali developer from Clariant Japan KK (a 2.38% TMAH aqueous solution; Product No. AZ300MIF) to prepare a positive relief pattern. The light exposure at which a 10-μm-square pattern is resolved was defined as a light exposure limit, and the developing time and light exposure limit are shown in Table 4.

TABLE 4

| | Light exposure limit (mJ/cm$^2$) | Developing time (Seconds) |
|---|---|---|
| Example 9 | 275 | 84 |
| Example 10 | 275 | 76 |
| Example 11 | 250 | 170 |
| Example 12 | 375 | 68 |
| Example 13 | 375 | 68 |
| Example 14 | 250 | 46 |
| Example 15 | 250 | 38 |
| Example 16 | 250 | 36 |
| Example 17 | 300 | 54 |
| Example 18 | 275 | 56 |
| Example 19 | 250 | 50 |
| Example 20 | 250 | 32 |
| Example 21 | 300 | 52 |
| Example 22 | 450 | 112 |
| Example 23 | 450 | 92 |
| Example 24 | 400 | 90 |
| Example 25 | 450 | 120 |
| Example 26 | 275 | 66 |
| Example 27 | 275 | 58 |
| Example 28 | 275 | 58 |
| Comparative Example 3 | 225 | 76 |
| Comparative Example 4 | 225 | 62 |
| Comparative Example 5 | 225 | 56 |
| Comparative Example 6 | 225 | 52 |

All of the samples of Examples 9 to 28 and Comparative Examples 3 to 6 had satisfactory patterning performances in the method using an i-beam stepper.

INDUSTRIAL APPLICABILITY

The resin composition of the present invention can be suitably used in the fields of protective films and interlayer insulating films for semiconductor devices, cover coats for flexible copper-clad boards, solder resist films, liquid crystal alignment layers, and the like.

The invention claimed is:

1. A hydroxypolyamide having a structure represented by the general formula (1):

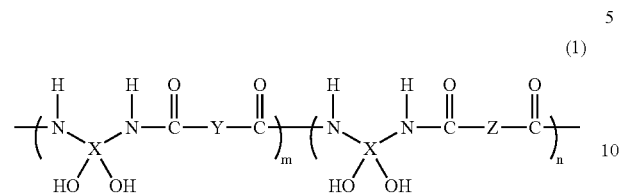
(1)

wherein m and n are integers satisfying m>0, n≧0, 2≦m+n≦1,000, and 0.05≦m/(m+n)≦1, and the recurring units may be arranged blockwise or randomly; X represents at least one tetravalent organic group selected from groups represented by the following formula (2); Y represents 5-aminoisophthalic acid having at least one hydrogen atom of the amino group substituted, from which a carboxylic acid group is excluded; and Z represents at least one divalent group selected from groups represented by the following formula (4),

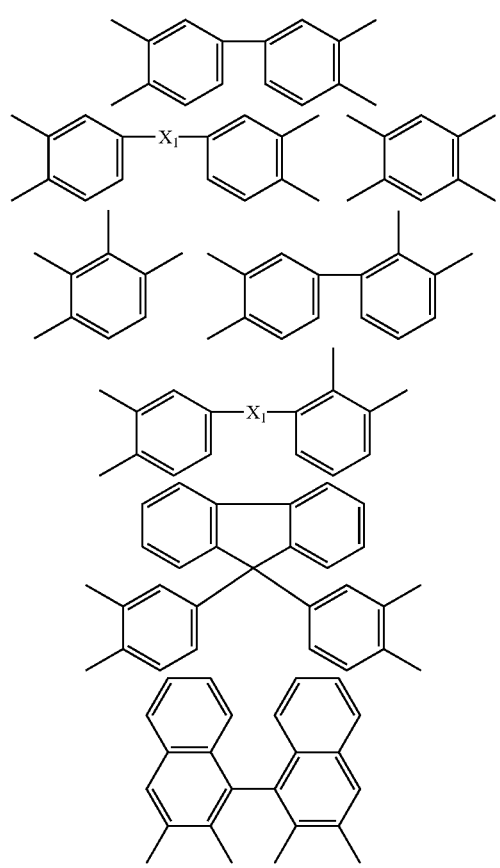
(2)

wherein $X_1$ represents a divalent organic group selected from groups represented by the following formula (5); and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group,

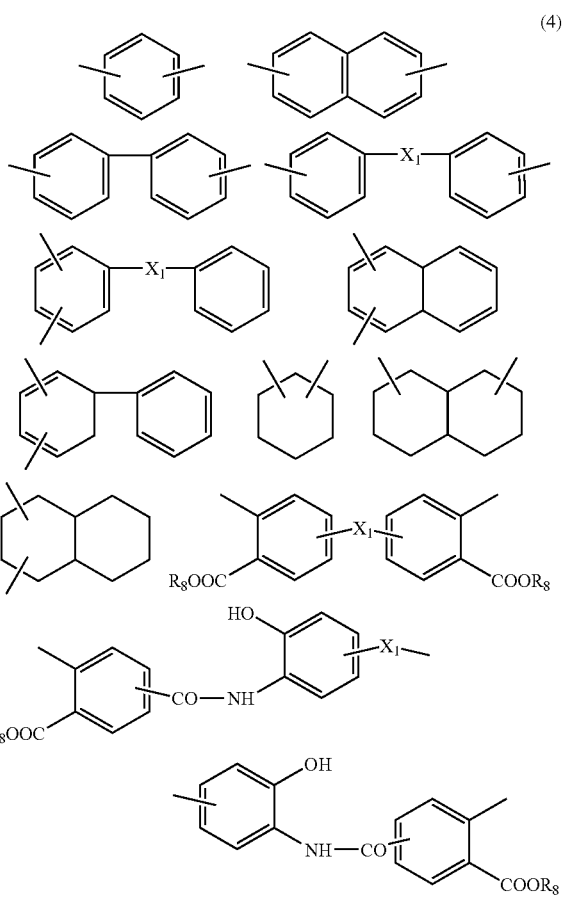
(4)

wherein $R_8$ represents a monovalent organic group; $X_1$ represents a divalent organic group selected from groups represented by the following formula (5); and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group, and

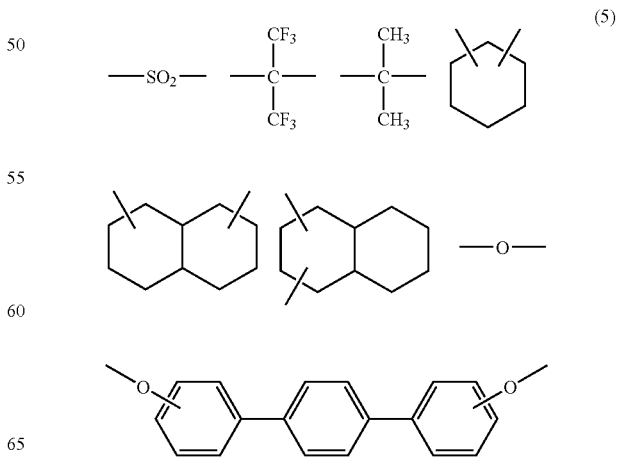
(5)

-continued

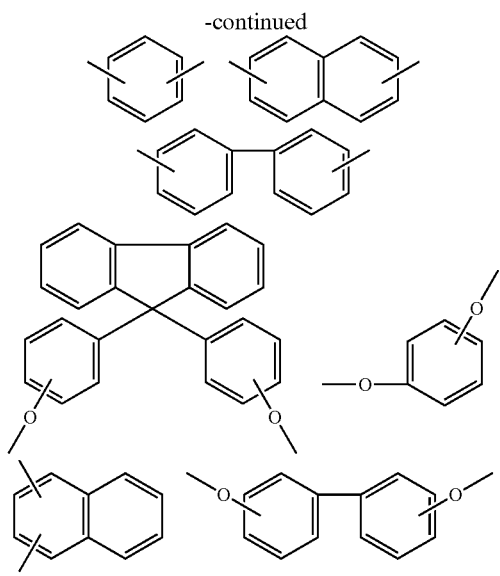

wherein the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group.

2. The hydroxypolyamide according to claim 1 wherein Y represents at least one divalent organic group selected from groups represented by the following formula (3):

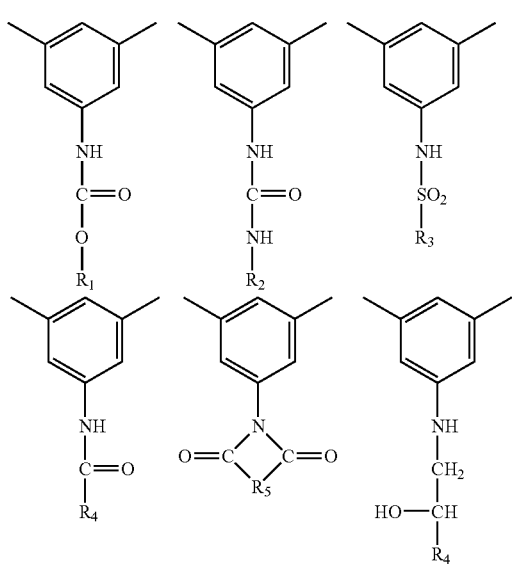

(3)

-continued

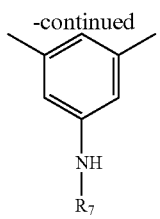

wherein $R_1$, $R_2$, $R_3$, $R_4$, and $R_6$ are each independently a monovalent organic group; $R_5$ is a divalent organic group; $R_7$ is at least one group selected from the group consisting of an aralkyl group, an arylsulfenyl group, a diarylphosphinyl group, and a tri-substituted silyl group; and the hydrogen atoms on each aromatic ring may be substituted with at least one group selected from the group consisting of a methyl group, an ethyl group, a propyl group, an isopropyl group, a butyl group, an isobutyl group, a t-butyl group, a fluorine atom, and a trifluoromethyl group.

3. A resin composition comprising 100 parts by mass of the hydroxypolyamide according no claim 1 or 2 (A) and 70 to 900 parts by mass of an organic solvent (D).

4. A resin composition comprising 100 parts by mass of the hydroxypolyamide according to claim 1 or 2 (A), 1 to 50 parts by mass of a crosslinking agent (B), and 70 to 900 parts by mass of an organic solvent (D).

5. A resin composition comprising 100 parts by mass of the hydroxypolyamide according to claim 1 or 2 (A), 1 to 100 parts by mass of an optically active compound with a naphthoquinonediazide group (C), and 70 to 900 parts by mass of an organic solvent (D), and having positive photosensitivity.

6. A resin composition comprising 100 parts by mass of the hydroxypolyamide according to claim 1 or 2 (A), 1 to 50 parts by mass of a crosslinking agent (B), 1 to 100 parts by mass of an optically active compound with a naphthoquinonediazide group (C), and 70 to 900 parts by mass of an organic solvent (D), and having positive photosensitivity.

7. The resin composition according to claim 4 or 6 wherein the crosslinking agent (B) is an acrylate compound.

8. The resin composition according to claim 4 or 6 wherein the crosslinking agent (B) is an epoxy compound.

9. A process for producing a cured relief pattern, comprising the steps of: applying the resin composition according to claim 5 or 6 onto a substrate; exposing the resultant coating film to an active light through a mask or directly irradiating the coating film with actinic rays; eluting and removing the part exposed or irradiated with the actinic rays using a developer; and heating the resultant positive relief pattern at 150 to 400° C.

10. A semiconductor device having a layer made of a cured relief pattern obtained by the production process according to claim 9.

\* \* \* \* \*

UNITED STATES PATENT AND TRADEMARK OFFICE
CERTIFICATE OF CORRECTION

PATENT NO. : 7,416,822 B2 Page 1 of 1
APPLICATION NO. : 10/597091
DATED : August 26, 2008
INVENTOR(S) : Kanada et al.

It is certified that error appears in the above-identified patent and that said Letters Patent is hereby corrected as shown below:

At Column 40, line 23 (Claim 3, line 2) of the printed patent, "no" should be --to--.

At Column 40, line 23 (Claim 3, line 2) of the printed patent, delete "or 2" before (A).

At Column 40, line 26 (Claim 4, line 2) of the printed patent, delete "or 2" before (A).

At Column 40, line 30 (Claim 5, line 2) of the printed patent, delete "or 2" before (A).

At Column 40, line 35 (Claim 6, line 2) of the printed patent, delete "or 2" before (A).

At Column 40, line 40 (Claim 7, line 1) of the printed patent, delete "or 6" before wherein.

At Column 40, line 42 (Claim 8, line 1) of the printed patent, delete "or 6" before wherein.

At Column 40, line 46 (Claim 9, line 3) of the printed patent, delete "or 6" before onto.

Signed and Sealed this

Fourteenth Day of April, 2009

JOHN DOLL
*Acting Director of the United States Patent and Trademark Office*